US012439585B2

(12) United States Patent
Han

(10) Patent No.: US 12,439,585 B2
(45) Date of Patent: Oct. 7, 2025

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 510 days.

(21) Appl. No.: 17/843,921

(22) Filed: Jun. 17, 2022

(65) Prior Publication Data

US 2022/0328490 A1    Oct. 13, 2022

Related U.S. Application Data

(63) Continuation of application No. 17/158,935, filed on Jan. 26, 2021, now Pat. No. 11,393,823.

(30) Foreign Application Priority Data

Aug. 3, 2020   (KR) ........................ 10-2020-0097001

(51) Int. Cl.
*H10B 12/00*      (2023.01)
*H10D 30/63*      (2025.01)
*H10D 64/27*      (2025.01)

(52) U.S. Cl.
CPC ............. *H10B 12/31* (2023.02); *H10B 12/33* (2023.02); *H10D 30/63* (2025.01); *H10D 64/512* (2025.01)

(58) Field of Classification Search
CPC .......... H01L 27/0688; H01L 29/42356; H01L 29/7827; H10B 12/01; H10B 12/03; H10B 12/033; H10B 12/036; H10B 12/05; H10B 12/30; H10B 12/31; H10B 12/315; H10B 12/33; H10D 30/63; H10D 64/512; H10D 88/00

See application file for complete search history.

(56) References Cited

U.S. PATENT DOCUMENTS 6,188,095 B1    2/2001   Hieke
10,153,281 B2   12/2018   Derner et al.
(Continued)

FOREIGN PATENT DOCUMENTS

CN    109155312 A    1/2019
CN    109791784 A    5/2019
(Continued)

OTHER PUBLICATIONS

First Office Action from National Intellectual Property Administration of People's Republic of China for Application No. 202110522291.0 dated Oct. 10, 2024.

*Primary Examiner* — Britt D Hanley
*Assistant Examiner* — Kevin Quinto

(57) ABSTRACT

A method of manufacturing a semiconductor device comprises: forming a first array including a first bit line extending in a first direction, a first word line extending in a second direction intersecting the first direction, and a first transistor being located at a first intersection of the first word line and the first bit line, the first transistor being connected to the first word line and the first bit line; forming a first capacitor electrically connected to the first transistor, the first capacitor being located at a first part of the first intersection; and forming a second capacitor located at a second part of the first intersection.

11 Claims, 36 Drawing Sheets

(56) References Cited

U.S. PATENT DOCUMENTS

| | | | |
|---|---|---|---|
| 2002/0022360 A1 | 2/2002 | Kim et al. | |
| 2007/0292615 A1* | 12/2007 | Dordi | C23C 18/1893 |
| | | | 427/532 |
| 2011/0223731 A1 | 9/2011 | Chung et al. | |
| 2012/0086060 A1 | 4/2012 | Taniguchi | |
| 2018/0197942 A1* | 7/2018 | Ramaswamy | H01L 29/7827 |
| 2019/0066751 A1 | 2/2019 | Matsubara | |
| 2020/0194434 A1 | 6/2020 | Alzate et al. | |

FOREIGN PATENT DOCUMENTS

| | | |
|---|---|---|
| CN | 110192278 A | 8/2019 |
| CN | 103367317 A | 10/2023 |
| KR | 1020110102738 A | 9/2011 |

* cited by examiner

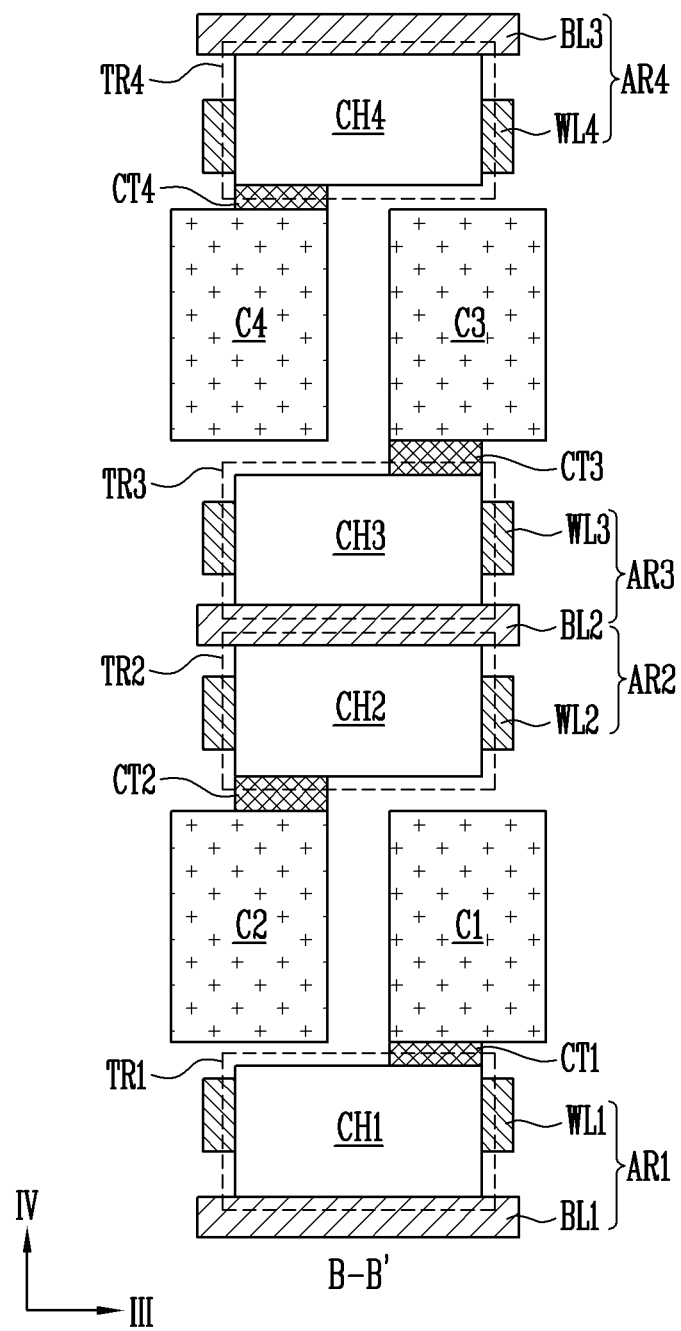

C-C'

C-C'

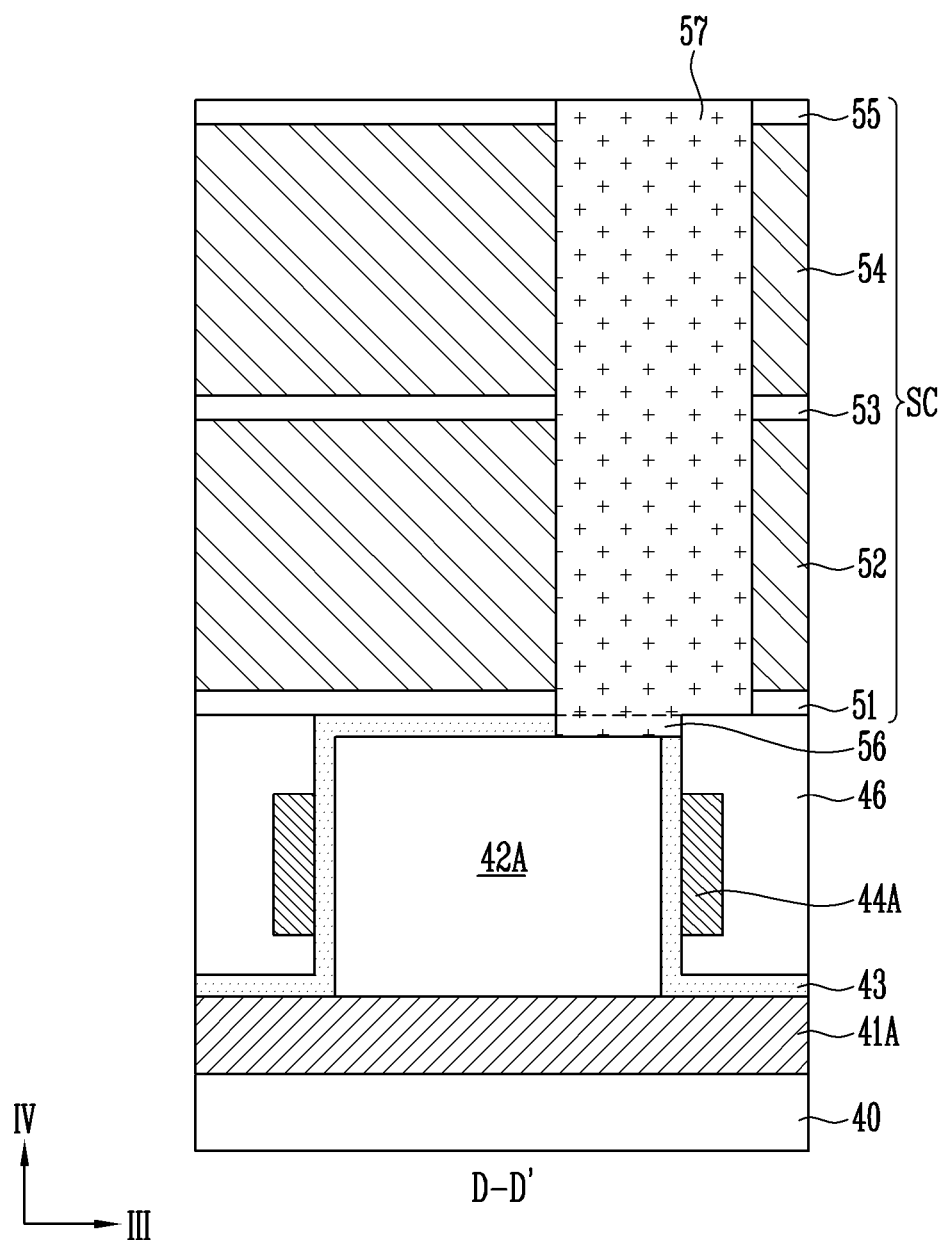

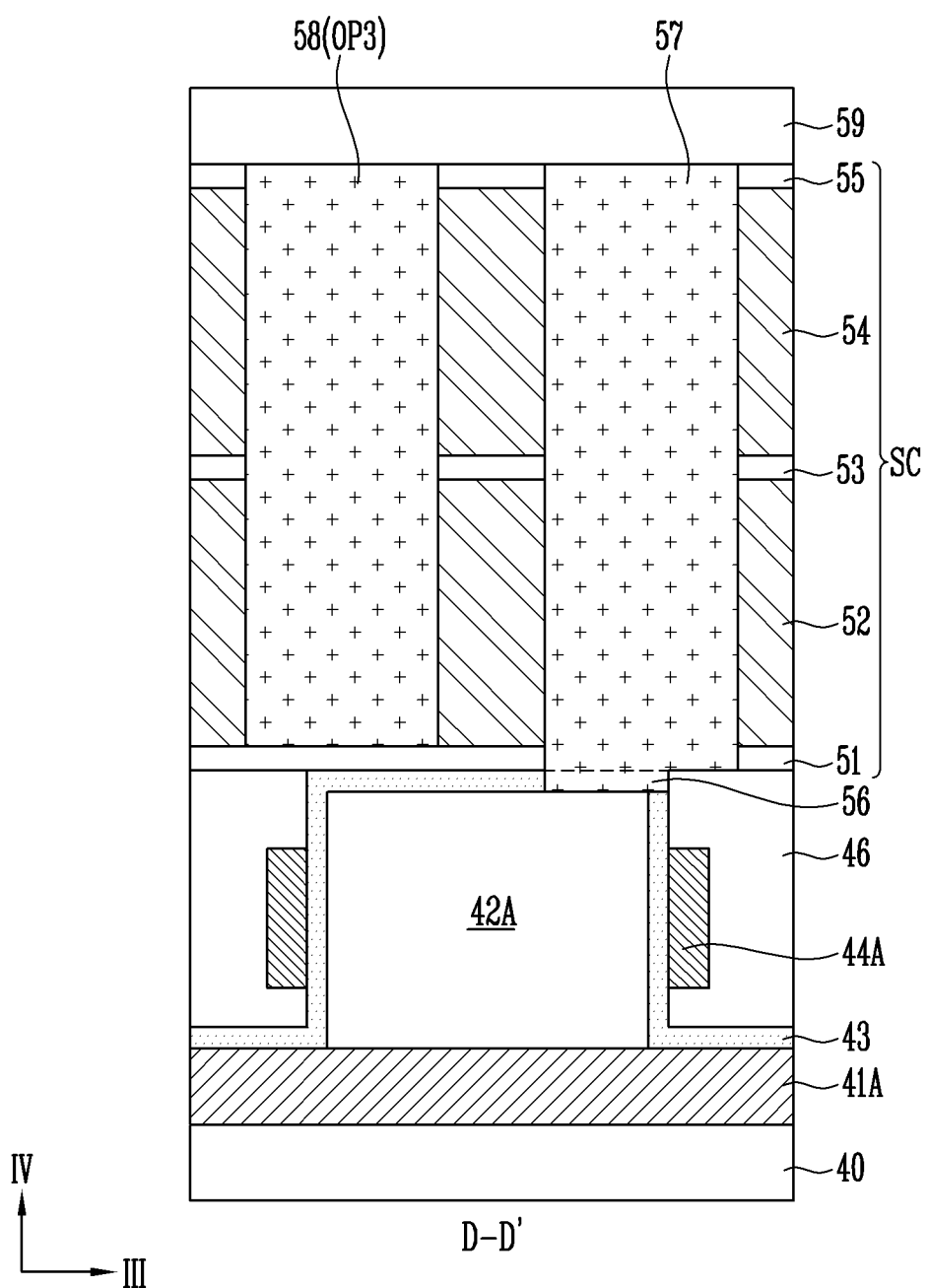

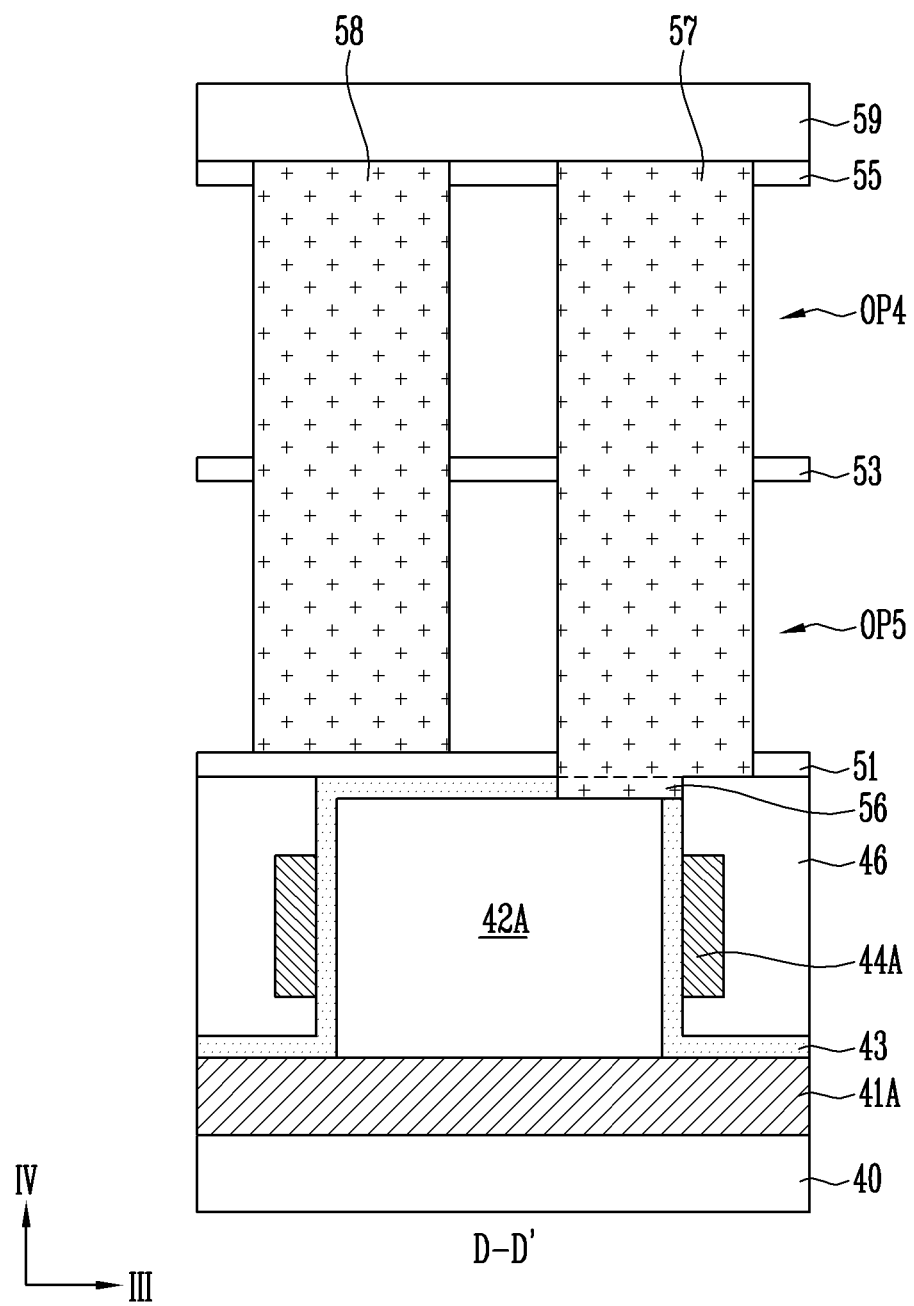

E-E'

E-E'

F-F'

D-D'

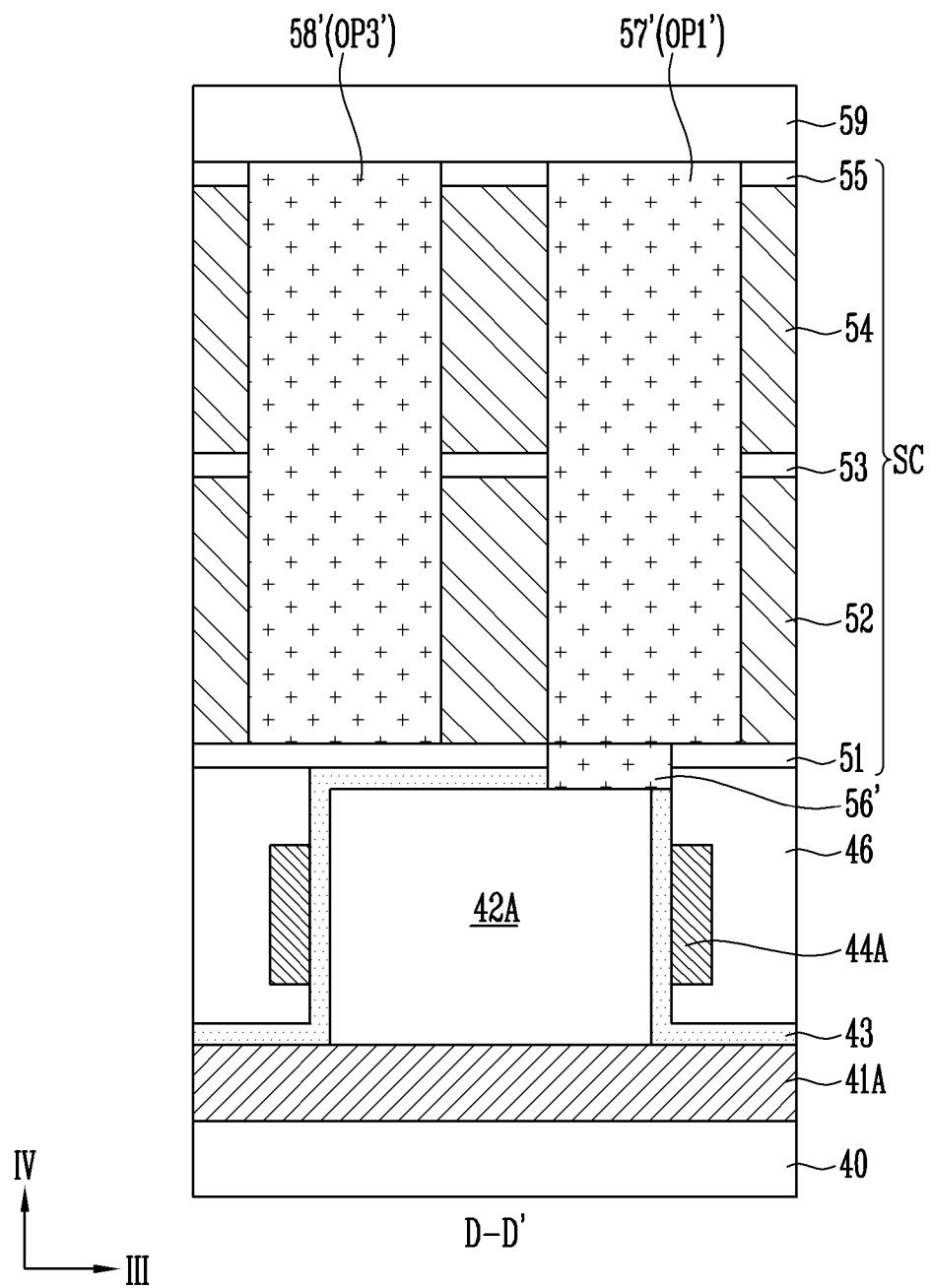

SEMICONDUCTOR DEVICE AND MANUFACTURING METHOD OF SEMICONDUCTOR DEVICE

CROSS-REFERENCE TO RELATED APPLICATION

The present application is a continuation application of a U.S. patent application Ser. No. 17/158,935, filed on Jan. 26, 2021, which claims priority under 35 U.S.C. § 119(a) to Korean Patent Application Number 10-2020-0097001 filed on Aug. 3, 2020 in the Korean Intellectual Property Office, the entire disclosure of which is incorporated herein by reference.

BACKGROUND

1. Field of Invention

The present disclosure generally relates to an electronic device, and more particularly, to a semiconductor device and a method of manufacturing a semiconductor device.

2. Description of Related Art

A degree of integration of a semiconductor device is mainly determined by an area occupied by a unit memory cell. As improvements in the degree of integration of semiconductor devices with memory cells formed in a single layer over a substrate reach their limit, there has recently been proposed a three-dimensional semiconductor device in which memory cells are stacked over a substrate. Various structures and manufacturing methods have been developed to improve the operational reliability of such three-dimensional semiconductor devices.

SUMMARY

Embodiments provide a semiconductor device having a stable structure and improved characteristics, and a manufacturing method of the semiconductor device.

In accordance with an aspect of the present disclosure, there is provided a semiconductor device including: a first bit line extending in a first direction; a first word line extending in a second direction intersecting the first direction; a first transistor located at a first intersection of the first word line and the first bit line, the first transistor being connected to the first word line and the first bit line; a first capacitor electrically connected to the first transistor, the first capacitor being located at a first part of the first intersection; a second capacitor electrically isolated from the first transistor, the second capacitor being located at a second part of the first intersection; and a second transistor electrically connected to the second capacitor, the first capacitor and the second capacitor being located between the first transistor and the second transistor.

In accordance with another aspect of the present disclosure, there is provided a semiconductor device including: first vertical transistors arranged in a first direction and a second direction intersecting the first direction; second vertical transistors located above the first vertical transistors, the second vertical transistors being arranged in the first direction and the second direction; first capacitors located between the first vertical transistors and the second vertical transistors, the first capacitors being electrically connected to the first vertical transistors; and second capacitors located between the first vertical transistors and the second vertical transistors, the second capacitors being electrically connected to the second vertical transistors, wherein the second capacitors are arranged between the first capacitors.

In accordance with still another aspect of the present disclosure, there is provided a method of manufacturing a semiconductor device, the method including: forming a first array including a first bit line extending in a first direction, a first word line extending in a second direction intersecting the first direction, and a first transistor being located at a first intersection of the first word line and the first bit line, the first transistor being connected to the first word line and the first bit line; forming a first capacitor electrically connected to the first transistor, the first capacitor being located at a first part of the first intersection; and forming a second capacitor located at a second part of the first intersection.

BRIEF DESCRIPTION OF THE DRAWINGS

Example embodiments will now be described more fully hereinafter with reference to the accompanying drawings; however, embodiments contemplated by this disclosure may be embodied in different forms and should not be construed as limited to the embodiments set forth herein. Rather, these example embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 3A and 3B are views illustrating a structure of a semiconductor device in accordance with an embodiment of the present disclosure.

FIGS. 4A, 4B, 5A, 5B, 6A to 6D, 7A to 7E, 8A to 8C, 9A, 9B, 10A, and 10B are views illustrating a manufacturing method of a semiconductor device in accordance with an embodiment of the present disclosure.

FIGS. 15A and 15B are views illustrating a manufacturing method of a semiconductor device in accordance with an embodiment of the present disclosure.

DETAILED DESCRIPTION

The specific structural or functional description disclosed herein is merely illustrative for the purpose of describing embodiments according to concepts of the present disclosure. The embodiments according to concepts of the present disclosure can be implemented in various forms, and cannot be construed as limited to the embodiments set forth herein.

Figure 1A:
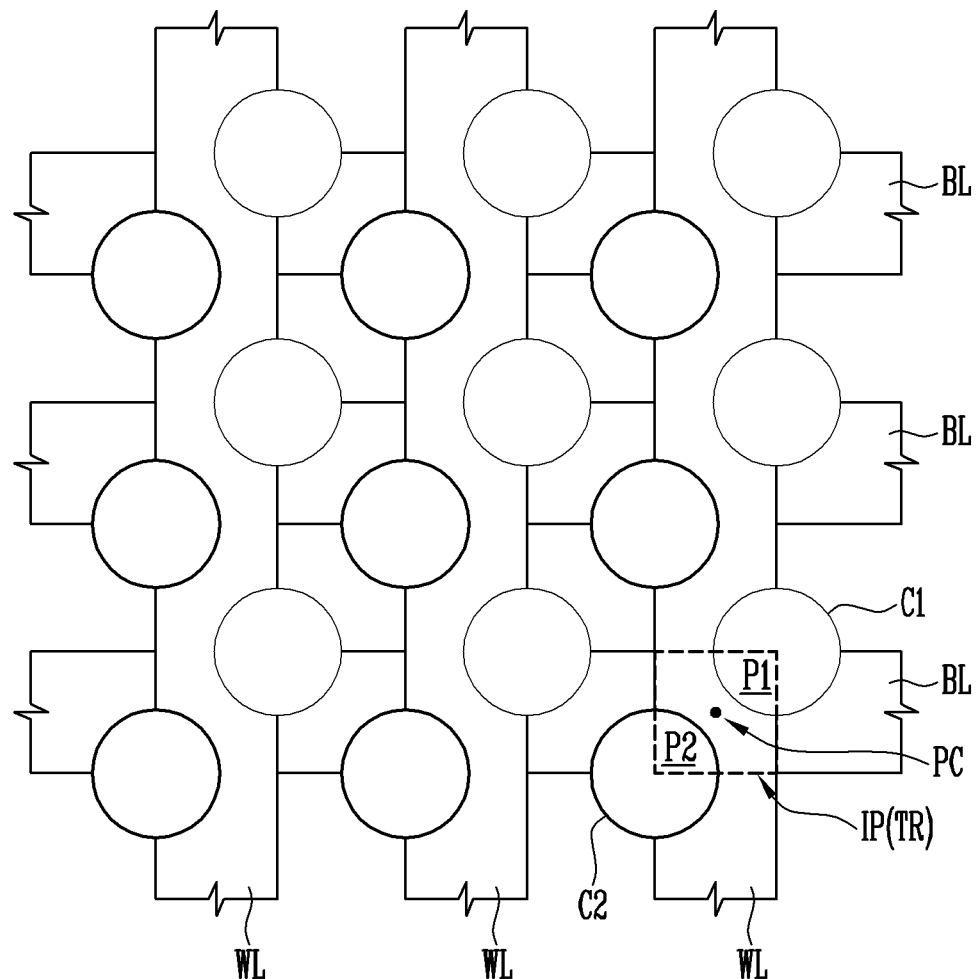
FIG. 1A to 1C are views illustrating a structure of a semiconductor device in accordance with an embodiment of the present disclosure.
Figure 1B:
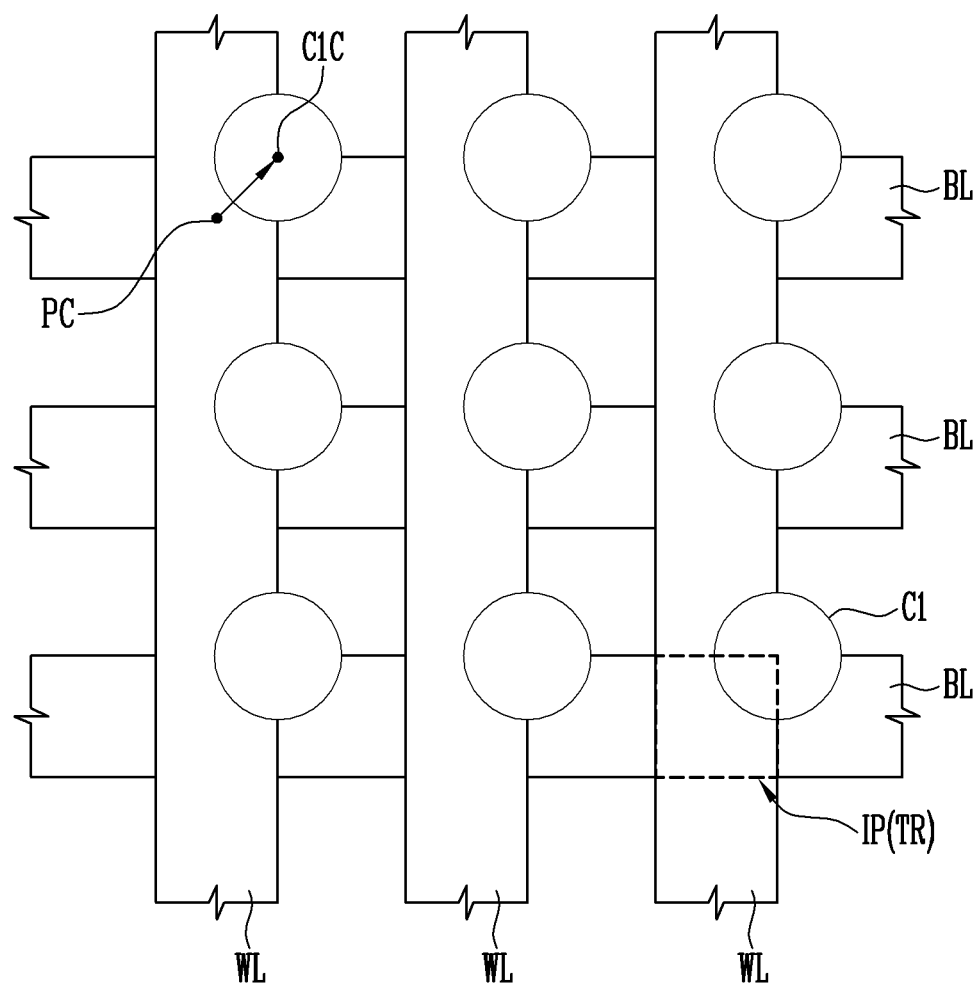
Figure 1B:
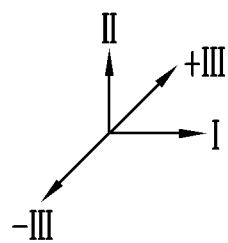
Figure 1C:
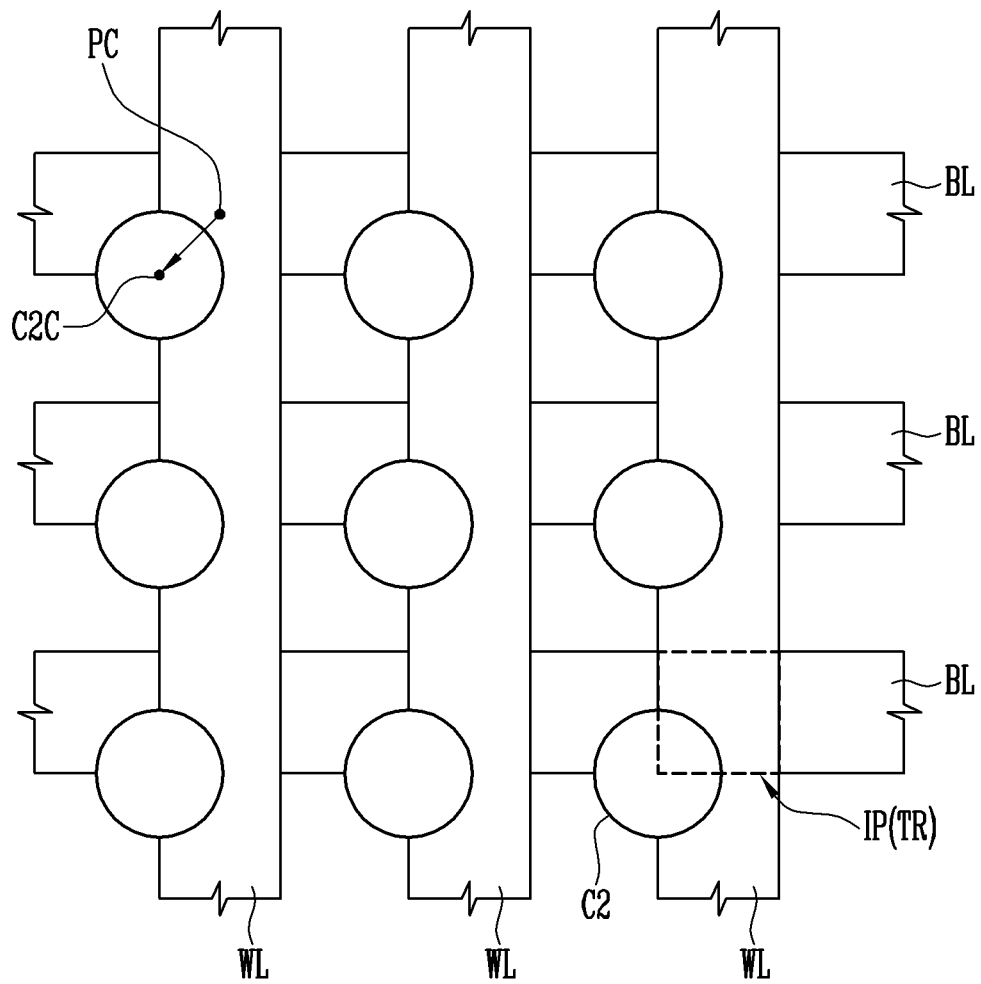

FIG. 1A to 1C are views illustrating a structure of a semiconductor device in accordance with an embodiment of the present disclosure.

Referring to FIGS. 1A to 1C, a semiconductor device may include bit lines BL, word lines WL, transistors TR, and first capacitors C1 in a view perpendicular to a plane formed by a first direction I and a second direction II.

The bit lines BL may extend in the first direction I. The word lines WL may extend in the second direction II intersecting the first direction I. The bit lines BL and the word lines WL may be located at different levels. For example, the word lines WL may be located above the bit lines BL, or be located under the bit lines BL.

Intersections IP may be defined in regions in which the bit lines BL and the word lines WL intersect each other. The transistors TR may be respectively located at the intersections IP, and be respectively connected between the bit lines BL and the word lines WL. In an embodiment, the transistors TR may be vertical transistors including vertical channel layers penetrating the word lines WL or the bit lines BL.

According to this structure, the bit lines BL, the word lines WL, and the transistors TR may constitute a first array. In addition, the first capacitors C1 may be respectively connected electrically to the transistors TR. The first capacitors C1 may be located at a level different from that of the first array. For example, the first capacitors C1 may be located above or under the first array.

The first capacitors C1 may be arranged in the first direction I and the second direction II. The first capacitors C1 are located relative to their corresponding intersections IP. For example, the first capacitors C1 may be shifted towards one or more sides of the intersections IP. In an embodiment, the first capacitors C1 may be shifted in a positive third direction +III from the intersections IP. The third direction III may be a direction intersecting the first direction I and the second direction II in a plane formed by the first direction I and the second direction II.

The semiconductor device may further include second capacitors C2, which may be located between the first capacitors C1. The second capacitors C2 may be electrically isolated from the transistors TR, and may be electrically connected to transistors included in another array.

The second capacitors C2 may be arranged in the first direction I and the second direction II. The first capacitors C1 and the second capacitors C2 may be located at substantially the same level. For example, the first capacitors C1 and the second capacitors C2 may be located on a plane defined by the first direction I and the second direction II. The first capacitors C1 and the second capacitors C2 may be adjacent to each other in the third direction III.

The first capacitors C1 and the second capacitors C2 may be located such that a pair of first and second capacitors C1 and C2 share one intersection IP. Each of the intersections IP may include a first part P1 and a second part P2. The first capacitor C1 may be located at or near the first part P1, and a portion of the first capacitor C1 may overlap with the first part P1. The second capacitor C2 may be located at or near the second part P2, and a portion of the second capacitor C2 may overlap with the second part P2.

The first part P1 and the second part P2 in the intersection IP may be adjacent to each other in the third direction III. A center PC of the intersection IP may be located between the first part P1 and the second part P2. A first center C1C of the first capacitor C1 may be located to be shifted in the positive third direction +III from the center PC of the intersection IP. A second center C2C of the second capacitor C2 may be located to be shifted in a negative third direction −III from the center PC of the intersection IP.

According to the structure described above, the first capacitors C1 and the second capacitors C2, which are connected to different arrays, can be located at substantially the same level. Accordingly, the stack height of the semiconductor device can be decreased, and the degree of integration can be improved.

Figure 2A:
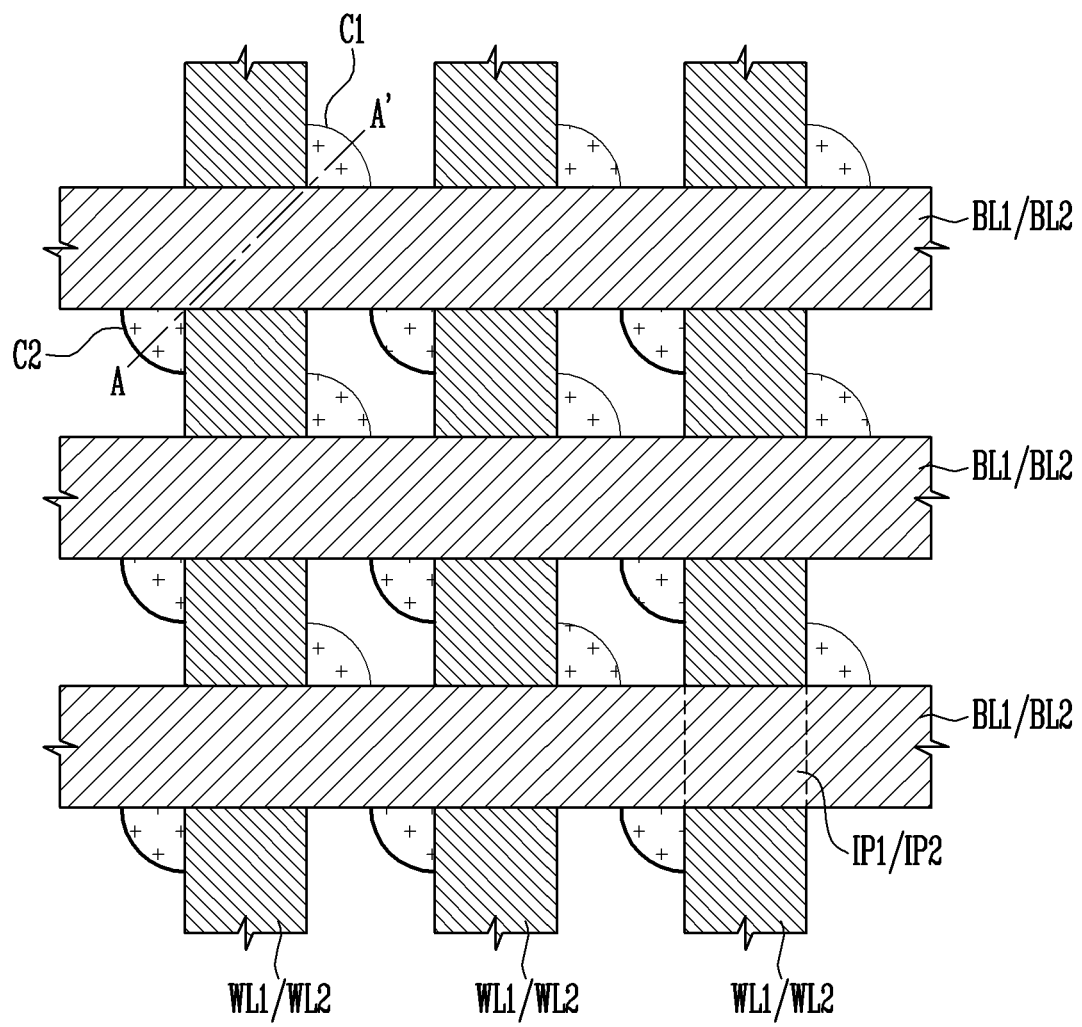
FIGS. 2A and 2B are views illustrating a structure of a semiconductor device in accordance with an embodiment of the present disclosure.
Figure 2B:
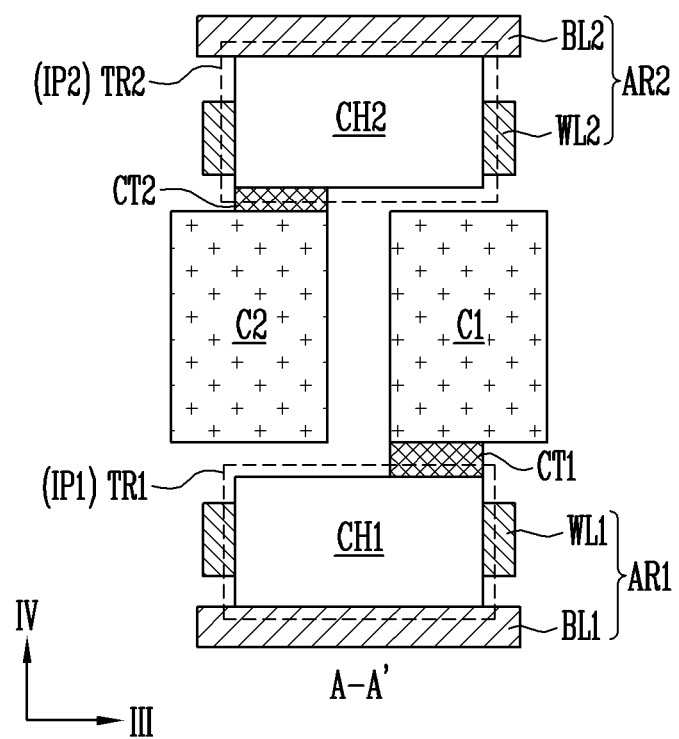

FIGS. 2A and 2B are views illustrating a structure of a semiconductor device in accordance with an embodiment of the present disclosure. FIG. 2A is a plan view, and FIG. 2B illustrates a section taken along line A-A' shown in FIG. 2A. Hereinafter, descriptions of elements substantially similar to those described above and with reference to FIGS. 1A to 1C will be omitted.

Referring to FIGS. 2A and 2B, a semiconductor device may include a first array AR1, first capacitors C1 electrically connected to the first array AR1, a second array AR2, and second capacitors C2 electrically connected to the second array AR2. The semiconductor device may further include a first contact structure CT1 and the second contact structure CT2.

The first array AR1 may include first bit lines BL1 that respectively correspond to first word lines WL1. The first array AR1 may further include first transistors TR1 that connect the corresponding first bit lines BL1 and first word lines WL1. In a planar view, such as in FIG. 2A, the first transistors TR1 may be respectively located at first intersections IP1 of the first word lines WL1 and the first bit lines BL1. Each of the first transistors TR1 may include a first channel layer CH1. The first channel layer CH1 may penetrate the first word line WL1, and the first word line WL1 may surround a sidewall of the first channel layer CH1. In a section view, such as in FIG. 2B, the first transistor TR1 may be located at substantially the same level as the first word line WL1. Although not shown in the drawings, the semiconductor device may further include a first gate insulating layer surrounding the first channel layer CH1. The first gate insulating layer may be interposed between the first channel layer CH1 and the first word line WL1.

The second array AR2 may include second bit lines BL2 that respectively correspond to second word lines WL2. The second array AR2 may further include second transistors TR2 that connect the corresponding second bit lines BL2 and second word lines WL2. In a planar view, such as in FIG. 2A, the second transistors TR2 may be respectively located at second intersections IP2 of the second word lines WL2 and the second bit lines BL2. Each of the second transistors TR2 may include a second channel layer CH2. The second channel layer CH2 may penetrate the second word line WL2, and the second word line WL2 may surround a sidewall of the second channel layer CH2. In a section view, such as in FIG. 2B, the second transistor TR2 may be located at substantially the same level as the second word line WL2. Although not shown in the drawings, the semiconductor device may further include a second gate insulating layer surrounding the second channel layer CH2. The second gate insulating layer may be interposed between the second channel layer CH2 and the second word line WL2.

The first array AR1 and the second array AR2 may be stacked or arranged in a fourth direction IV. The fourth direction IV may be a direction protruding from a plane defined by the first direction I and the second direction II. For example, the fourth direction IV may be a vertical direction.

The first array AR1 and the second array AR2 may have a structure in which the first array AR1 and the second array AR2 are symmetrical to each other, or have a structure in which the first array AR1 and the second array AR2 are not symmetrical to each other. The first bit lines BL1 and the second bit lines BL2 may extend in the first direction I, and corresponding first bit lines BL1 and second bit lines BL2 may overlap in the fourth direction IV. The first word lines WL1 and the second word lines WL2 may extend in the second direction II and corresponding first word lines WL1 and second word lines WL2 may overlap in the fourth direction IV. Corresponding first intersections IP1 and second intersections IP2 may overlap in the fourth direction IV. Corresponding first transistors TR1 and second transistors TR2 may be overlap in the fourth direction IV.

The first capacitors C1 and the second capacitors C2 may be located between the first array AR1 and the second array AR2. The first capacitor C1 may be connected to the first channel layer CH1 through the first contact structure CT1. The first capacitor C1 may be electrically connected to the first transistor TR1, and may be electrically isolated from the second transistor TR2. The second capacitor C2 may be connected to the second channel layer CH2 through the second contact structure CT2. The second capacitor C2 may be electrically connected to the second transistor TR2, and may be electrically isolated from the first transistor TR1.

For convenience of description, "C1" shown in FIG. 2B represents a configuration of the first capacitor, such as an electrode included in the first capacitor. The first capacitor may include a pillar-shaped first electrode, a plate-shaped second electrode, and a dielectric layer interposed between the first electrode and the second electrode. The first capacitor and the second capacitor may each individually include first electrodes, but may share a second electrode with each other. Therefore, "C1" may represent the first electrode of the first capacitor. Similarly, for convenience of description, "C2" represents a configuration of the second capacitor, and such as the first electrode included in the second capacitor.

According to the structure described above, the first capacitors C1 of the first array AR1 and the second capacitors C2 of the second array AR2 can be located at substantially the same level. Thus, the stack height of the semiconductor device can be decreased, and the degree of integration can be improved.

Figure 3A:
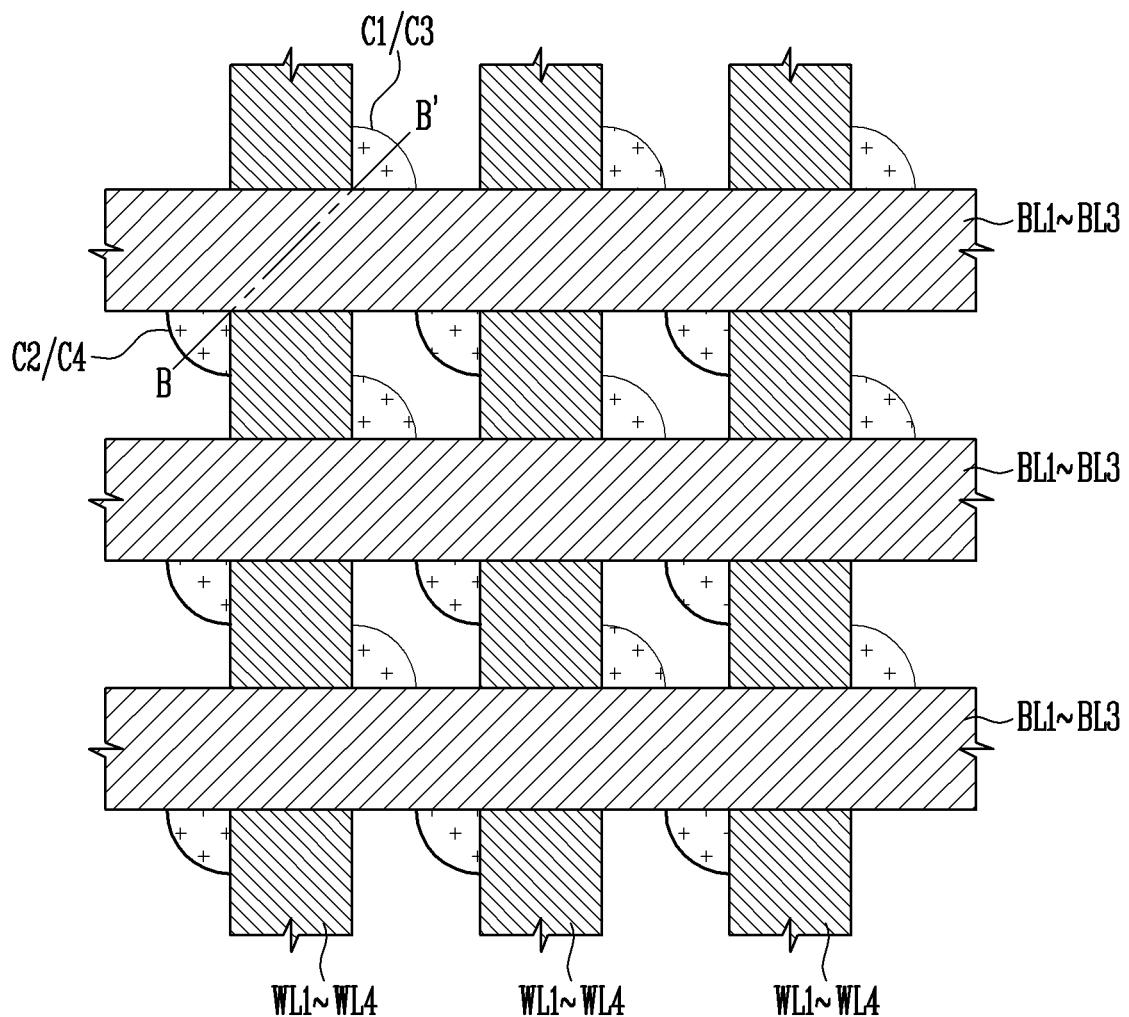

FIGS. 3A and 3B are views illustrating a structure of a semiconductor device in accordance with an embodiment of the present disclosure. FIG. 3A is a plan view, and FIG. 3B illustrates a section taken along line B-B' shown in FIG. 3A. Hereinafter, descriptions of elements substantially similar to those described above and with reference to FIGS. 1A to 2B will be omitted.

Referring to FIGS. 3A and 3B, a semiconductor device may include a first array AR1, first capacitors C1 electrically connected to the first array AR1, a second array AR2, second capacitors C2 electrically connected to the second array AR2, a third array AR3, third capacitors C3 electrically connected to the third array AR3, a fourth array AR4, and fourth capacitors C4 electrically connected to the fourth array AR4. The semiconductor device may further include a first contact structure CT1, a second contact structure CT2, a third contact structure CT3, and a fourth contact structure CT4.

The third array AR3 may be located above the second array AR2, and share a second bit line BL2 with the second array AR2. The third array AR3 may include second bit lines BL2, third word lines WL3, and third transistors TR3. The fourth array AR4 may include third bit lines BL3, fourth word lines WL4, and fourth transistors TR4.

According to the structure described above, the second array AR2 and the third array AR3 can share the second bit lines BL2 with each other. Thus, the stack height of the semiconductor device can be decreased, and the degree of integration can be improved.

FIGS. 4A, 4B, 5A, 5B, 6A to 6D, 7A to 7E, 8A to 8C, 9A, 9B, 10A, and 10B are views illustrating a manufacturing method of a semiconductor device in accordance with an embodiment of the present disclosure. FIGS. 4A, 5A, 6A, 7A, 8A, 9A, and 10A are layouts, FIGS. 4B, 5B, and 6B to 6D are sectional views taken along line C-C', and FIGS. 7B to 7E, 8B, 8C, 9B, and 10B are sectional views taken along line D-D'. Hereinafter, descriptions of elements substantially similar to those described above and with reference to FIGS. 1A to 3B will be omitted.

Figure 4A:
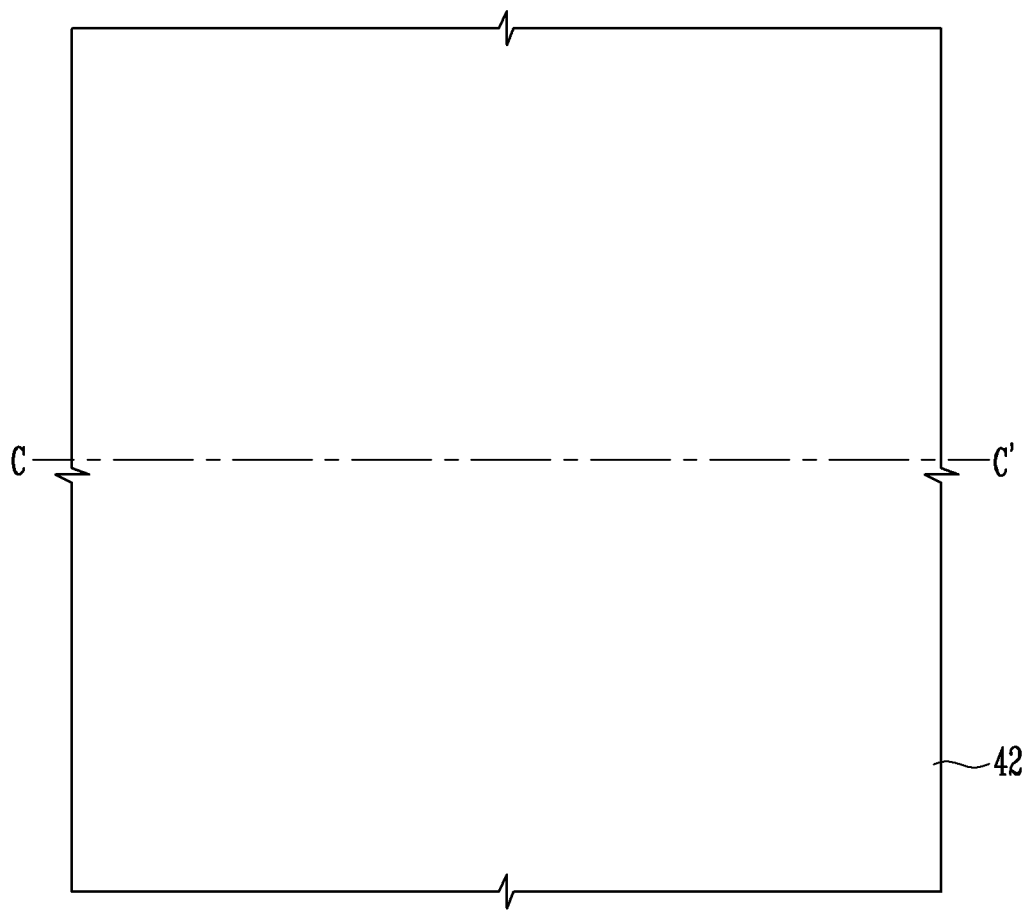
Figure 4B:
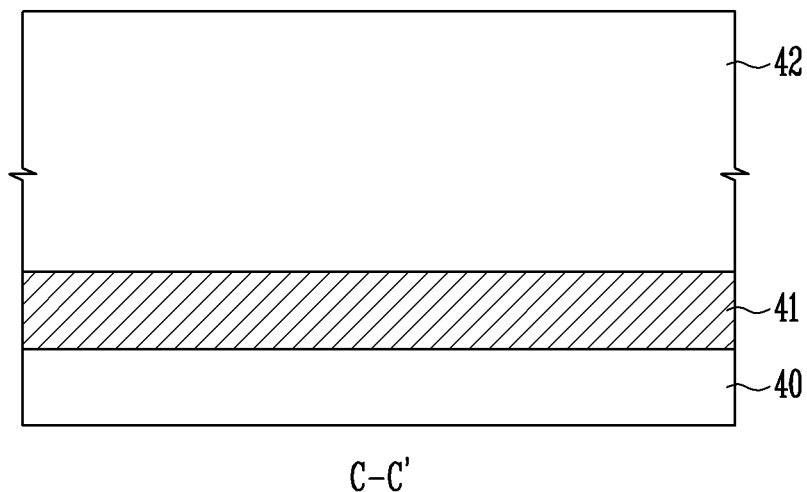

Referring to FIGS. 4A and 4B, a first conductive layer 41 is formed on a base 40, and a first channel material layer 42 is formed on the first conductive layer 41. The base 40 may be a semiconductor substrate, and include a lower structure such as a peripheral circuit. The first conductive layer 41 is used to form a bit line or a word line. The first conductive layer 41 may include poly-silicon, tungsten, metal, etc. The first conductive layer 41 may be deposited through a sputtering process, a Chemical Vapor Deposition (CVD) process, an Atomic Layer Deposition (ALD) process, etc.

The first channel material layer 42 is used to form a channel layer in which a channel of a transistor is generated. The first channel material layer 42 may include a semiconductor material such as poly-silicon or silicon germanium, or may include an oxide semiconductor such as Indium Gallium Zinc Oxide (IGZO). The first channel material layer 42 may include a junction. The first channel material layer 42 may be deposited through a sputtering process, a Chemical Vapor Deposition (CVD) process, an Atomic Layer Deposition (ALD) process, etc.

Figure 5A:
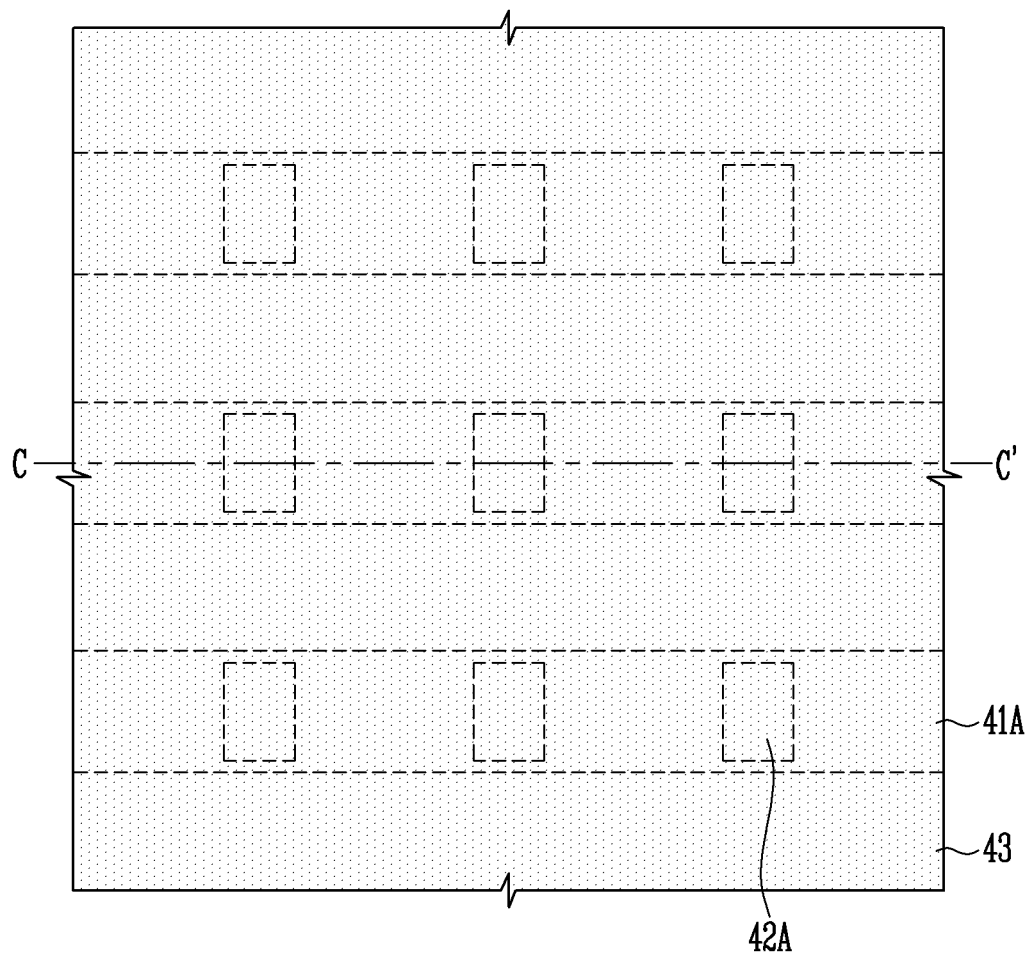
Figure 5B:
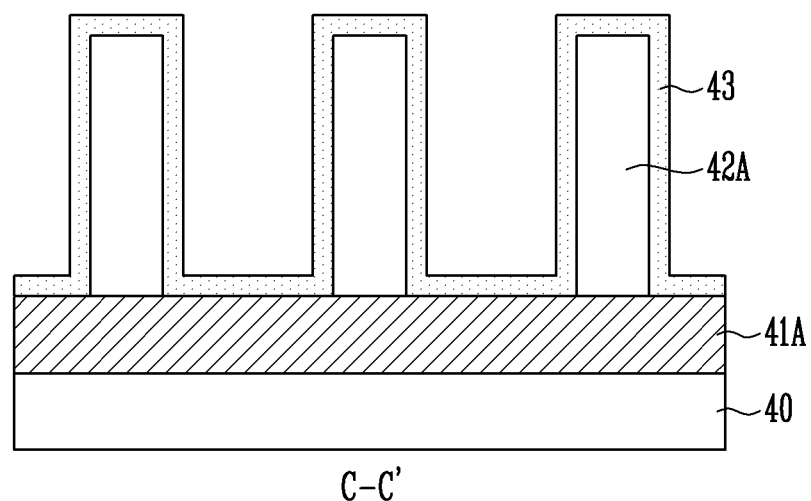

Referring to FIGS. 5A and 5B, first bit lines 41A and first channel layers 42A are formed. In an embodiment, the first channel material layer 42 and the first conductive layer 41 are patterned by using a line-shaped mask pattern extending in the first direction I as shown in FIG. 5A. Subsequently, the first channel material layer 42 is patterned by using a line-shaped mask pattern extending in the second direction II. Accordingly, the first bit lines 41A extending in the first direction I may be formed. In addition, the first channel layers 42A may be formed, which are located on the first bit lines 41A and are arranged in the first direction I and the second direction II.

Subsequently, a first gate insulating layer 43 surrounding the first channel layers 42A is formed. The first gate insulating layer 43 may be conformally formed along a profile of the first channel layers 42A and the first bit lines 41A, and over the base 40. Subsequently, a portion of the first gate insulating layer 43 formed over the base 40 may be etched. The first gate insulating layer 43 may include oxide.

Referring to FIGS. 6A to 6D, first word lines 44A are formed, which surround sidewalls of the first channel layers 42A and extend in the second direction II. Hereinafter, a method of forming the first word lines 44A will be described for each process.

Figure 6A:
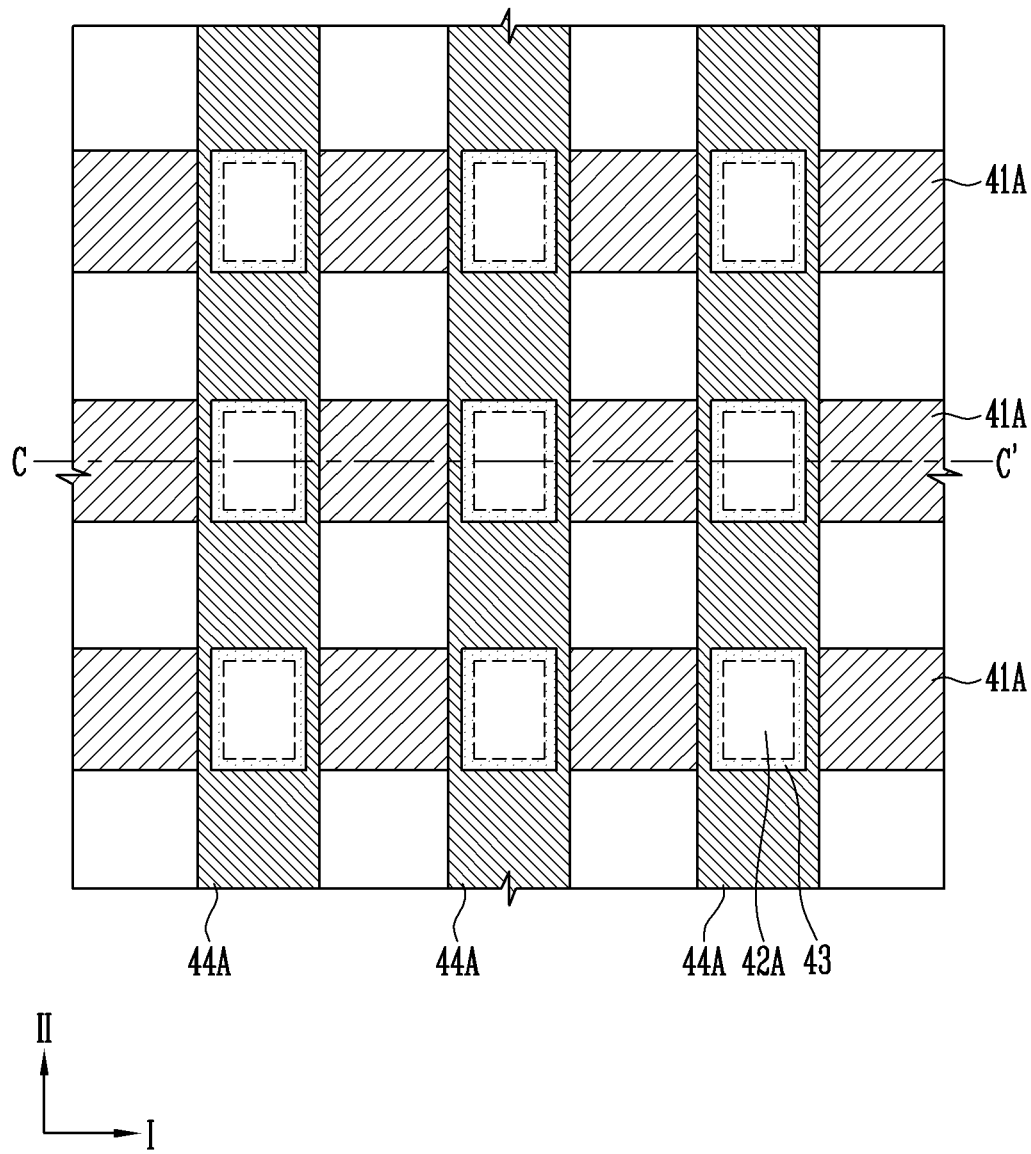
Figure 6B:
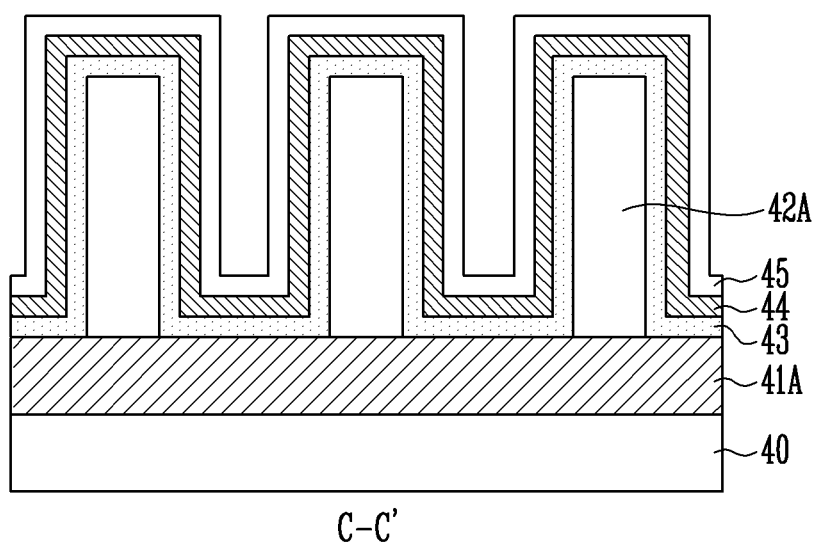
Figure 6B:
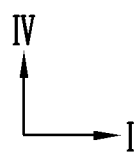

First, referring to FIGS. 6A and 6B, a second conductive layer 44 is formed on the first gate insulating layer 43. The second conductive layer 44 may be conformally formed along a profile of the first gate insulating layer 43. The second conductive layer 44 is used to form a bit line or a word line. The second conductive layer 44 may include poly-silicon, tungsten, metal, etc. The second conductive layer 44 may be deposited through a sputtering process, a Chemical Vapor Deposition (CVD) process, an Atomic Layer Deposition (ALD) process, etc.

Subsequently, a protective layer 45 is formed on the second conductive layer 44. The protective layer 45 may be conformally formed along a profile of the second conductive layer 44. The protective layer 45 may include a material having an etch selectivity with respect to the second conductive layer 44. The protective layer 45 may include an insulating material such as oxide or nitride.

Figure 6C:
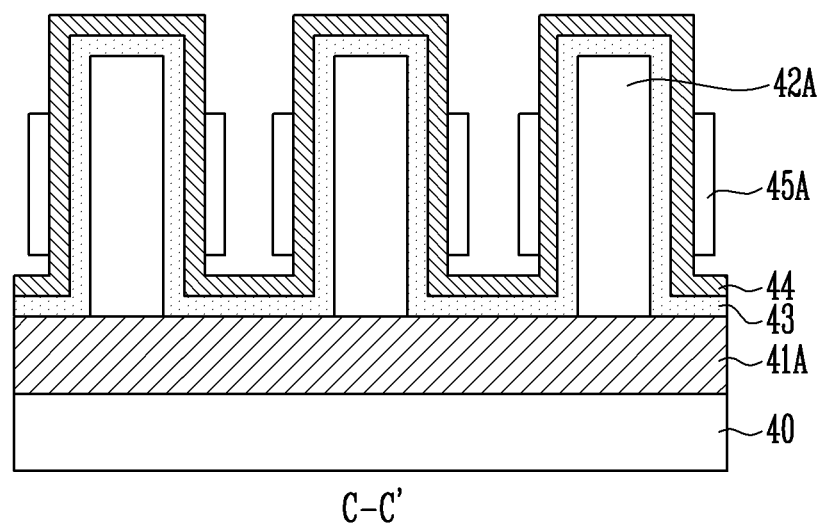
Figure 6C:
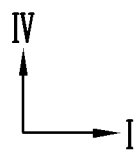

Referring to FIGS. 6A and 6C, protective patterns 45A partially exposing the second conductive layer 44 is formed by etching the protective layer 45. The protective patterns 45A may be formed to surround the sidewalls of the first channel layers 42A. In an embodiment, the protective patterns 45A may be formed by etching the protective layer 45 through an anisotropic etching process. The anisotropic etching process may be a dry etching process. Accordingly, portions of the protective layer 45, which correspond to upper surfaces and sidewalls of the first channel layers 42A and upper surfaces of the first bit lines 41A, may be etched. In addition, portions of the second conductive layer 44, which correspond to the upper surfaces and sidewalls of the first channel layers 42A and the upper surfaces of the first bit lines 41A, may be exposed.

Figure 6D:
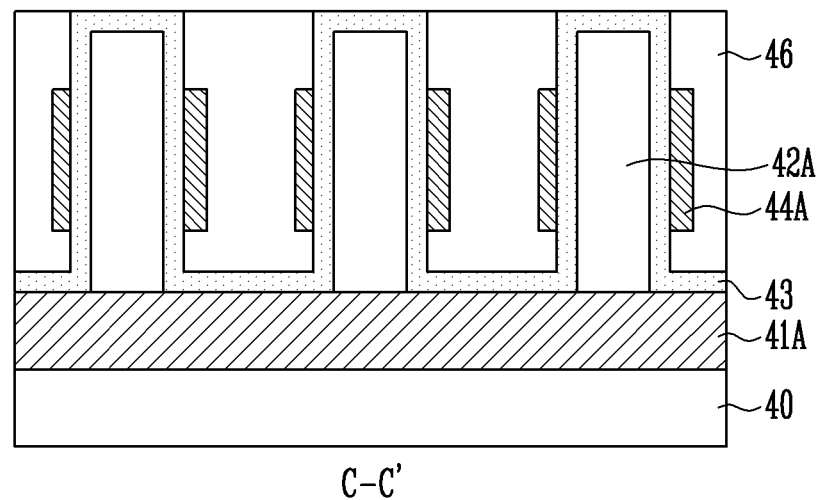
Figure 6D:
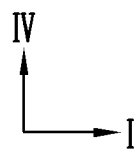

Referring to FIGS. 6A and 6D, the second conductive layer 44 is etched by using the protective patterns 45A as an etch barrier. Accordingly, the first word lines 44A extending in the second direction II are formed, and first transistors are formed at portions at which the first channel layers 42A and the first word lines 44A intersect each other.

Subsequently, an interlayer insulating layer 46 is formed. In an embodiment, after an insulating material is formed to fill a space between the first word lines 44A, the insulating material is planarized until an upper surface of the first gate insulating layer 43 is exposed. The interlayer insulating layer 46 may include an insulating material such as oxide.

Accordingly, a first array may be formed, which includes the first bit lines 41A, the first word lines 44A, and the first transistors.

Referring to FIGS. 7A to 7E, a first electrode layer 57 of a first capacitor and a first electrode layer 58 of a second capacitor are formed. Hereinafter, a method of forming the first electrode layers 57 and 58 will be described for each process.

Figure 7A:
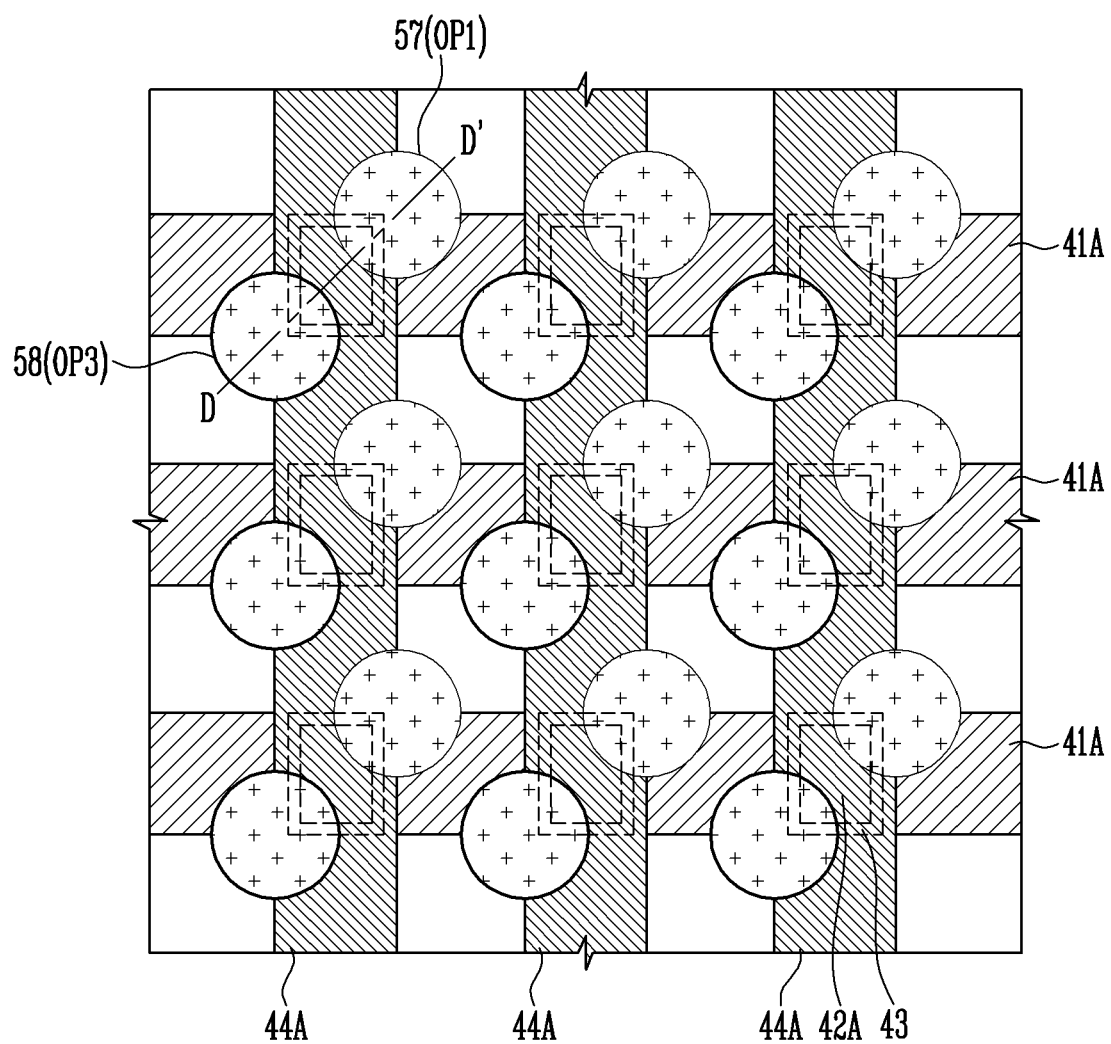
Figure 7B:
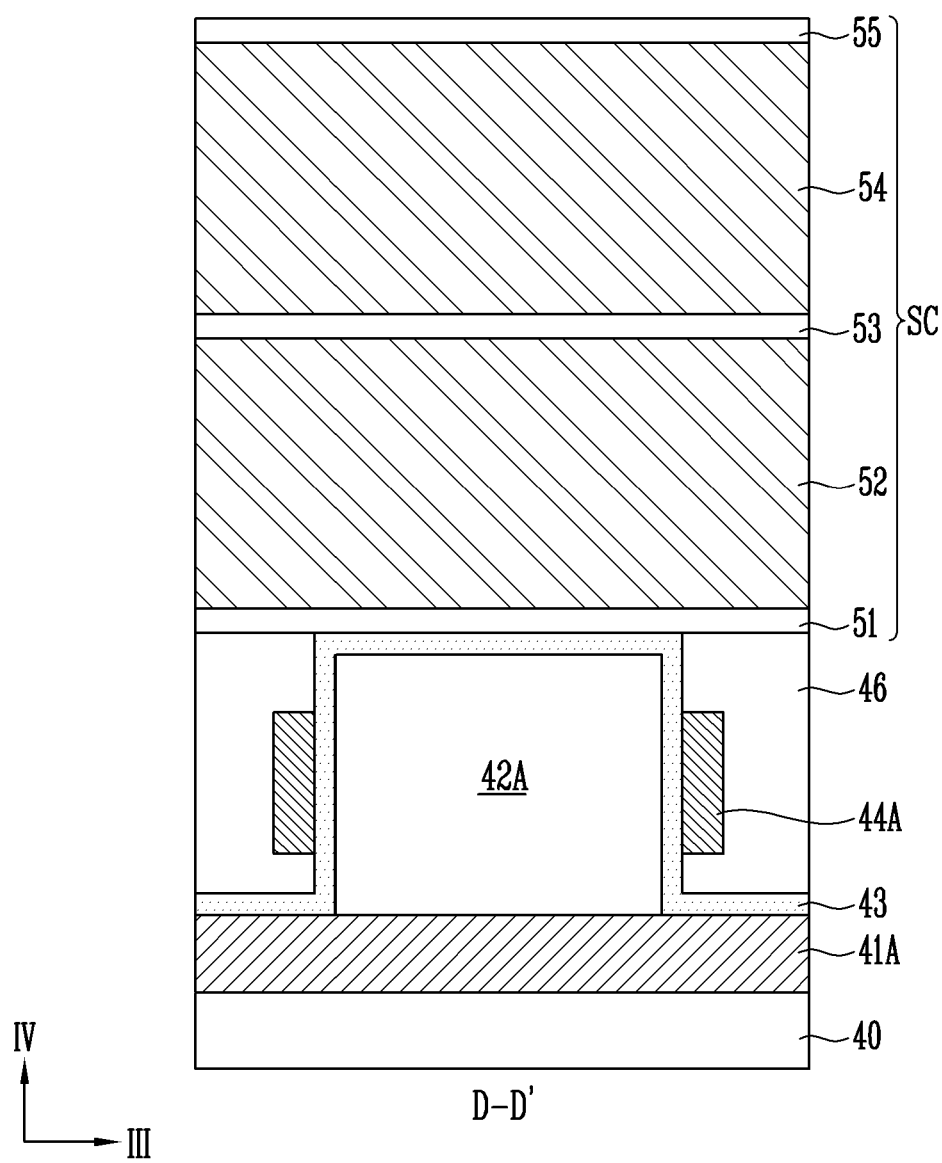

Referring to FIGS. 7A and 7B, a sacrificial structure SC for a capacitor is formed on the interlayer insulating layer 46 and the first gate insulating layer 43. The sacrificial structure SC may include at least one cap layer and at least one sacrificial layer, which are alternately stacked. The sacrificial layer may include a material having an etch selectivity higher than that of the cap layer. In an embodiment, the cap layer may include a nitride-based material, and the sacrificial layer may include an oxide-based material. FIGS. 7A through 7E are representative illustrations, and the number of cap layers and sacrificial layers, which are included in the sacrificial structure SC, may be changed in other embodiments.

In an embodiment, the sacrificial structure SC is formed by forming, on the interlayer insulating layer 46 and the first gate insulating layer 43, a first cap layer 51, a first sacrificial layer 52, a second cap layer 53, a second sacrificial layer 54, and a third cap layer 55. The first cap layer 51, the second cap layer 53, or the third cap layer 55 may be used as a support in a subsequent process, or may be used as an etch stop layer. The first cap layer 51, the second cap layer 53, or the third cap layer 55 may include nitride. The first sacrificial layer 52 and the second sacrificial layer 54 are used to secure a position at which electrodes of the first capacitor and the second capacitor are to be formed, and may include oxide.

Figure 7C:
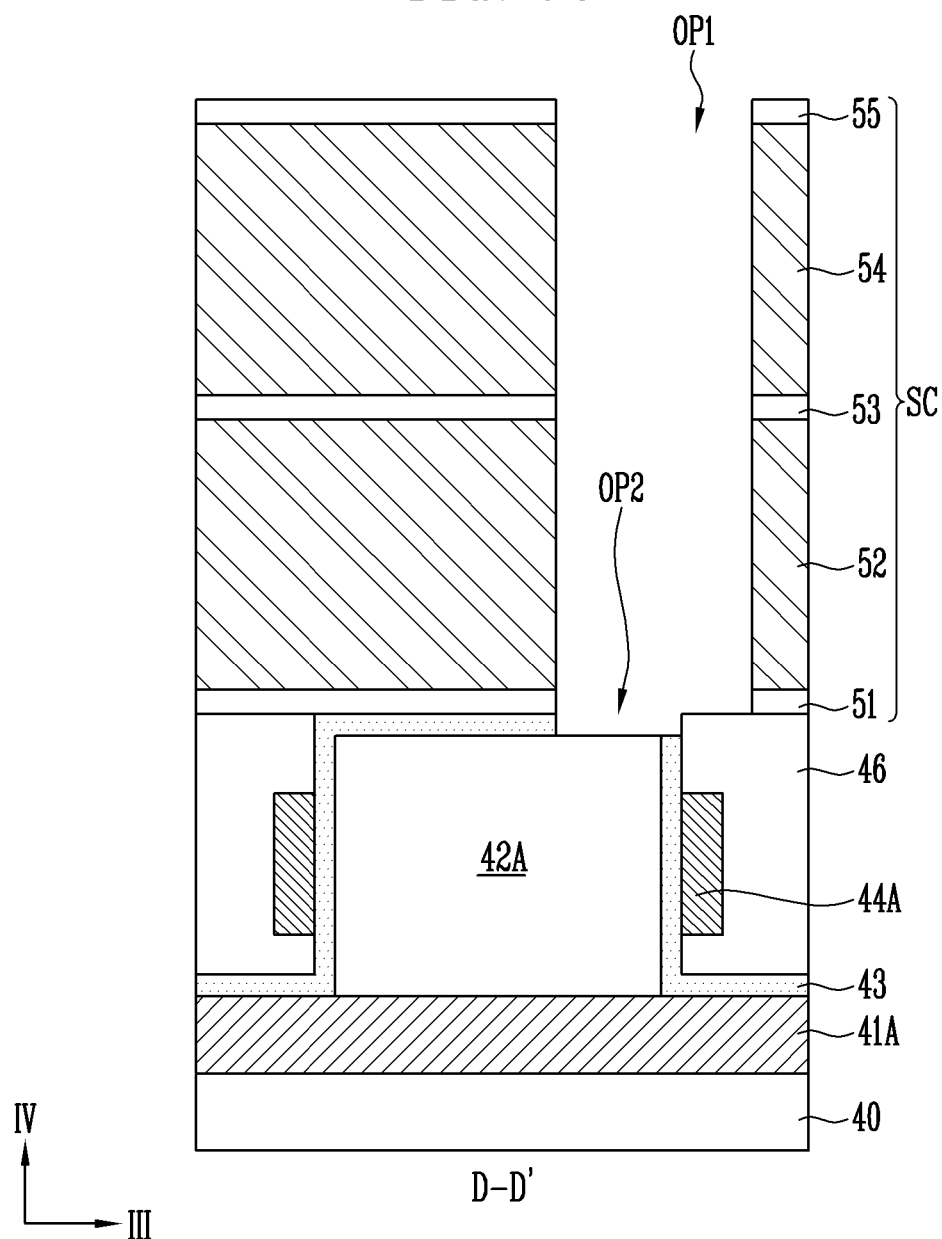

Referring to FIGS. 7A and 7C, first openings OP1 are formed, which penetrate the sacrificial structure. Each of the first openings OP1 may be formed to have a depth in which the first opening OP1 penetrates the third cap layer 55, the second sacrificial layer 54, the second cap layer 53, the first sacrificial layer 52, and the first cap layer 51. The first opening OP1 may be used to form the first electrode layer of the first capacitor. The first gate insulating layer 43 may be exposed through the first opening OP1, and the interlayer insulating layer 46 may be further exposed.

Subsequently, a second opening OP2 exposing the first channel layer 42A is formed by selectively etching the first gate insulating layer 43. The second opening OP2 may be connected to the first opening OP1. The second opening OP2 may be used to form a first contact structure connecting the first capacitor and the first transistor.

Referring to FIGS. 7A and 7D, a first contact structure 56 in the second opening OP2 and the first electrode layer 57 in the first opening OP1 are formed. In an embodiment, the first contact structure 56 and the first electrode layer 57 may be a single layer. The first contact structure 56 and the first electrode layer 57 may include the same material.

After a conductive material is formed in the first opening OP1 and the second opening OP2, the first electrode layer 57 and the first contact structure 56 may be formed by planarizing the conductive material until the third cap layer 55 is exposed. The first contact structure 56 may penetrate the first gate insulating layer 43 and be electrically connected to the first channel layer 42A. The first electrode layer 57 may be electrically connected to the first channel layer 42A through the first contact structure 56.

The first contact structure 56 or the first electrode layer 57 may include a conductive material such as a metal, a metal compound, or poly-silicon. In an embodiment, the first contact structure 56 or the first electrode layer 57 may include iridium (Ir), ruthenium (Ru), a rhodium (Rh), palladium (Pd), aluminum (Al), silver (Ag), platinum (Pt), titanium (Ti), tantalum (Ta), tungsten (W), aluminum nitride (AlNx), titanium nitride (TiNx), tantalum nitride (TaNx), tungsten nitride (WNx) or doped poly-silicon, or include combinations thereof.

The first contact structure 56 and the first electrode layer 57 may be formed through separate processes. In an embodiment, the first contact structure 56 may be formed before the sacrificial structure SC is formed. After the second opening OP2 is formed, which penetrates the first gate insulating layer 43 and exposes the first channel layer 42A, the first contact structure 56 is formed in the second opening OP2. Subsequently, the sacrificial structure SC is formed. In another embodiment, the first contact structure 56 may be formed before the first sacrificial layer 52 is formed. After the second opening OP2 is formed, which penetrates the first cap layer 51 and the first gate insulating layer 43 and exposes the first channel layer 42A, the first contact structure 56 is formed in the second opening OP2. Subsequently, the remainder of the sacrificial structure SC is formed by forming the first sacrificial layer 52, the second cap layer 53, the second sacrificial layer 54, and the third cap layer 55. Then, the first opening OP1 may be formed to have a depth in which the first opening OP1 penetrates the sacrificial structure SC and exposes the first contact structure 56.

Referring to FIGS. 7A and 7E, third openings OP3 are formed, which penetrate the sacrificial structure SC. The third openings OP3 may be located between the first openings OP1, as seen in FIG. 7A. Each of the third openings OP3 may have a depth in which the third opening OP3 penetrates the third cap layer 55, the second sacrificial layer 54, the second cap layer 53, and the first sacrificial layer 52. The third opening OP3 may be used to form the first electrode layer of the second capacitor. The second capacitor is formed to be electrically isolated from the first transistor, so the third opening OP3 is formed to have a depth in which the third opening OP3 does not expose the first transistor. For example, the third opening OP3 may be formed to have a depth in which the third opening OP3 does not expose the first cap layer 51, exposes the first cap layer 51, or partially penetrates the first cap layer 51, but in all cases, the third opening OP3 does not expose the first channel layer 42A. In an embodiment, FIG. 7E illustrates a third opening OP3 that exposes a top surface of the first cap layer 51.

Subsequently, the first electrode layer 58 is formed in the third opening OP3. The first electrode layer 58 may be spaced apart from the first channel layer 42A and may be electrically isolated from the first channel layer 42A. The first electrode layer 58 of the second capacitor may substantially have the same height in the fourth direction IV as the first electrode layer 57 of the first capacitor, or have a height different from that of the first electrode layer 57 of the first capacitor. In an embodiment, an upper surface of the first electrode layer 58 and an upper surface of the first electrode layer 57 may be located at substantially the same level, and a lower surface of the first electrode layer 58 and a lower surface of the first electrode layer 57 may be located at different levels. For example, the lower surface of the first electrode layer 58 may be located at a level higher than that of the lower surface of the first electrode layer 57.

The first electrode layer 58 may substantially have the same material as the first electrode layer 57, or have a material different from that of the first electrode layer 57. The first electrode layer 58 may include a conductive material such as a metal, a metal compound, or poly-silicon. In an embodiment, the first electrode layer 57 may include iridium (Ir), ruthenium (Ru), a rhodium (Rh), palladium (Pd), aluminum (Al), silver (Ag), platinum (Pt), titanium (Ti), tantalum (Ta), tungsten (W), aluminum nitride (AlNx), titanium nitride (TiNx), tantalum nitride (TaNx), tungsten nitride (WNx) or doped poly-silicon, or include combinations thereof.

Subsequently, an interlayer insulating layer 59 is formed on the first electrode layer 58, the first electrode layer 57, and the third cap layer 55. The interlayer insulating layer 59 may include an insulating material such as oxide.

Figure 8A:
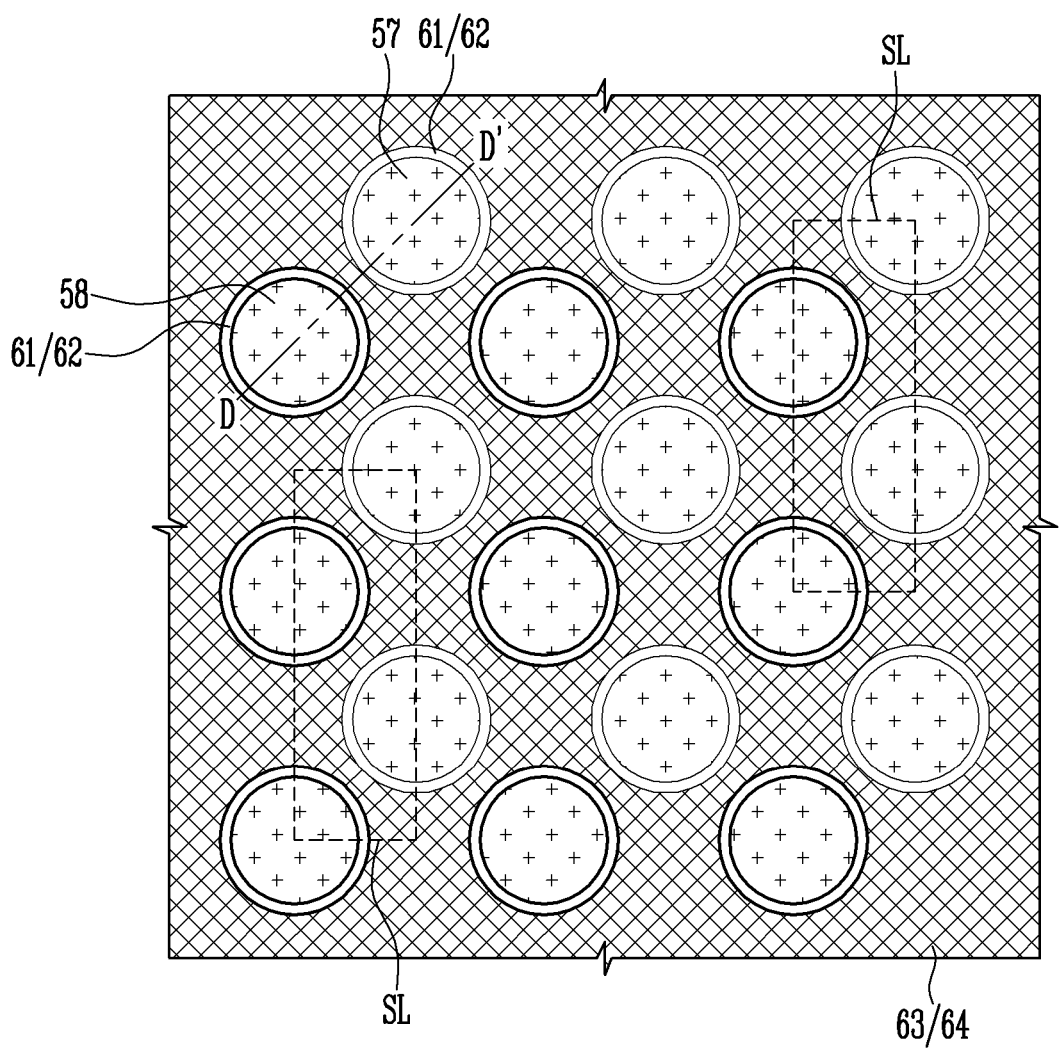
Figure 8C:
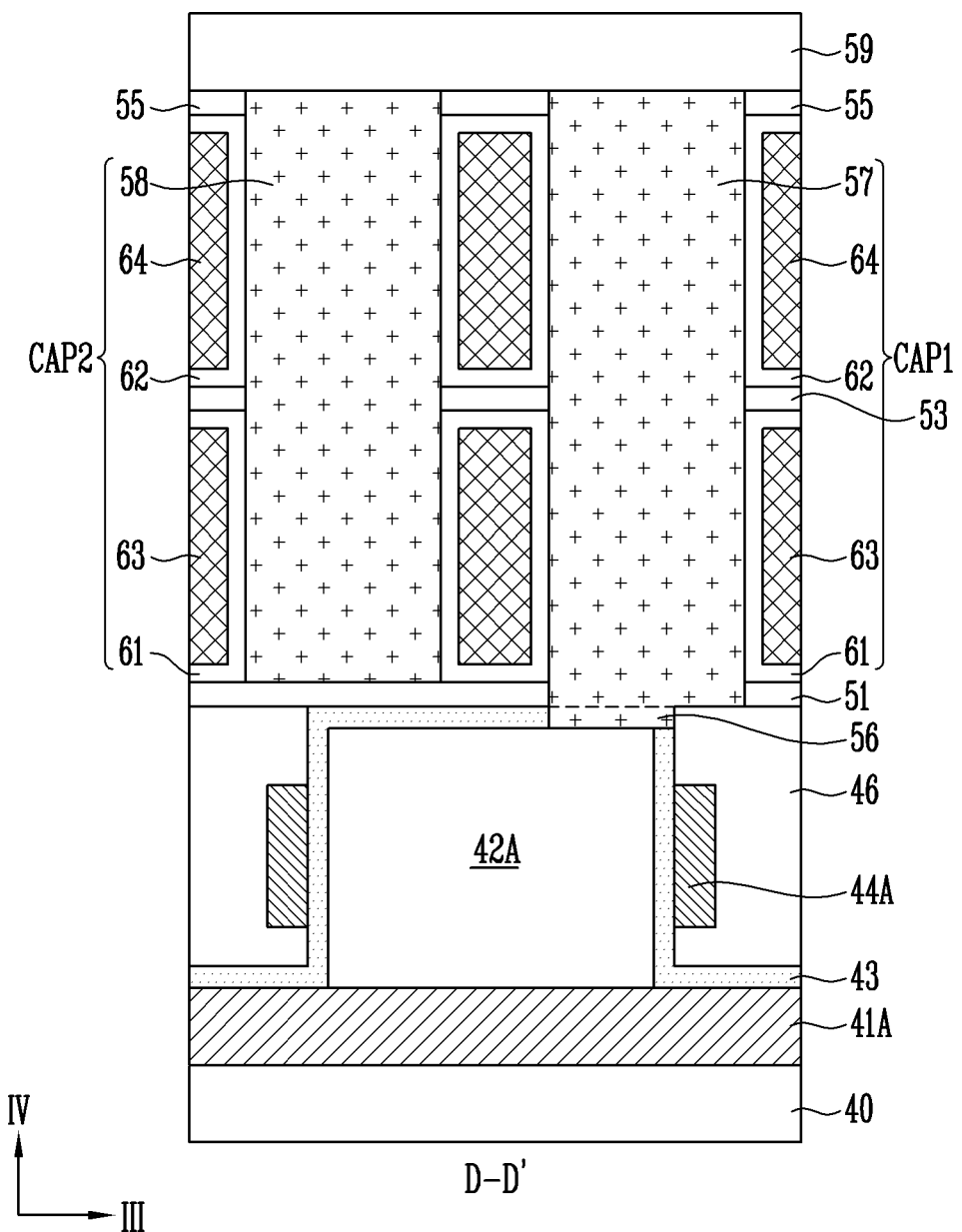

Referring to FIGS. 8A to 8C, a first capacitor CAP1 and a second capacitor CAP2 are formed. Hereinafter, a method of forming the first capacitor CAP1 and the second capacitor CAP2 will be described for each process.

Referring to FIGS. 8A and 8B, a slit SL is formed, which penetrates the sacrificial structure SC. The slit SL is used as a path through which the first sacrificial layer 52 and the second sacrificial layer 54 are replaced with an electrode layer, and may have a depth in which the slit SL exposes the first sacrificial layer 52 and the second sacrificial layer 54. The slit SL may have, in a planar view, various shapes such as a circular shape, an elliptical shape, a polygonal shape, and a linear or rectangular shape, for example.

After the slit SL is formed, a fifth opening OP5 is formed by removing the first sacrificial layer 52 through the slit SL. The first electrode layer 57, the first electrode layer 58, the first cap layer 51, and the second cap layer 53 may be exposed through the fifth opening OP5. A fourth opening OP4 is formed by removing the second sacrificial layer 54 through the slit SL. The first electrode layer 57, the first electrode layer 58, the second cap layer 53, and the third cap layer 55 may be exposed through the fourth opening OP4. The second sacrificial layer 54 may be removed when the first sacrificial layer 52 is removed, and the fourth opening OP4 may be formed when the fifth opening OP5 is formed.

Referring to FIGS. 8A and 8C, a first dielectric layer 61 and a second electrode layer 63 are formed in the fifth opening OP5. The first dielectric layer 61 may be formed in the fifth opening OP5, and the second electrode layer 63 may be formed on the first dielectric layer 61. The second electrode layer 63 may substantially include the same material as the first electrode layers 57 and 58, or include a material different from that of the first electrode layers 57 and 58. The second electrode layer 63 may include a conductive material such as a metal, a metal compound, or poly-silicon. In an embodiment, the second electrode layer 63 may include iridium (Ir), ruthenium (Ru), a rhodium (Rh), palladium (Pd), aluminum (Al), silver (Ag), platinum (Pt), titanium (Ti), tantalum (Ta), tungsten (W), aluminum nitride (AlNx), titanium nitride (TiNx), tantalum nitride (TaNx), tungsten nitride (WNx) or doped poly-silicon, or include combinations thereof.

A second dielectric layer 62 and a third electrode layer 64 are formed in the fourth opening OP4. The second dielectric layer 62 may be formed in the fourth opening OP4, and the third electrode layer 64 may be formed on the second dielectric layer 62. The second dielectric layer 62 may be formed when the first dielectric layer 61 is formed. The first dielectric layer 61 and the second dielectric layer 62 may substantially include the same material.

The third electrode layer 64 may be formed when the second electrode layer 63 is formed. The third electrode layer 64 may substantially include the same material as the second electrode layer 63, or include a material different from that of the second electrode layer 63. The third electrode layer 64 may include a conductive material such as a metal, a metal compound, or poly-silicon. In an embodiment, the third electrode layer 64 may include iridium (Ir), ruthenium (Ru), a rhodium (Rh), palladium (Pd), aluminum (Al), silver (Ag), platinum (Pt), titanium (Ti), tantalum (Ta), tungsten (W), aluminum nitride (AlNx), titanium nitride (TiNx), tantalum nitride (TaNx), tungsten nitride (WNx) or doped poly-silicon, or include combinations thereof.

Accordingly, the first capacitor CAP1 may be formed, which includes the first electrode layer 57, the first dielectric layer 61, the second dielectric layer 62, the second electrode layer 63, and the third electrode layer 64. The second capacitor CAP2 may be formed, which includes the first electrode layer 58, the first dielectric layer 61, the second dielectric layer 62, the second electrode layer 63, and the third electrode layer 64. The first capacitor CAP1 and the second capacitor CAP2 may share the second electrode layer 63 or share the third electrode layer 64, or each capacitor may include the second electrode layer 63 and the third electrode layer 64.

Figure 9A:
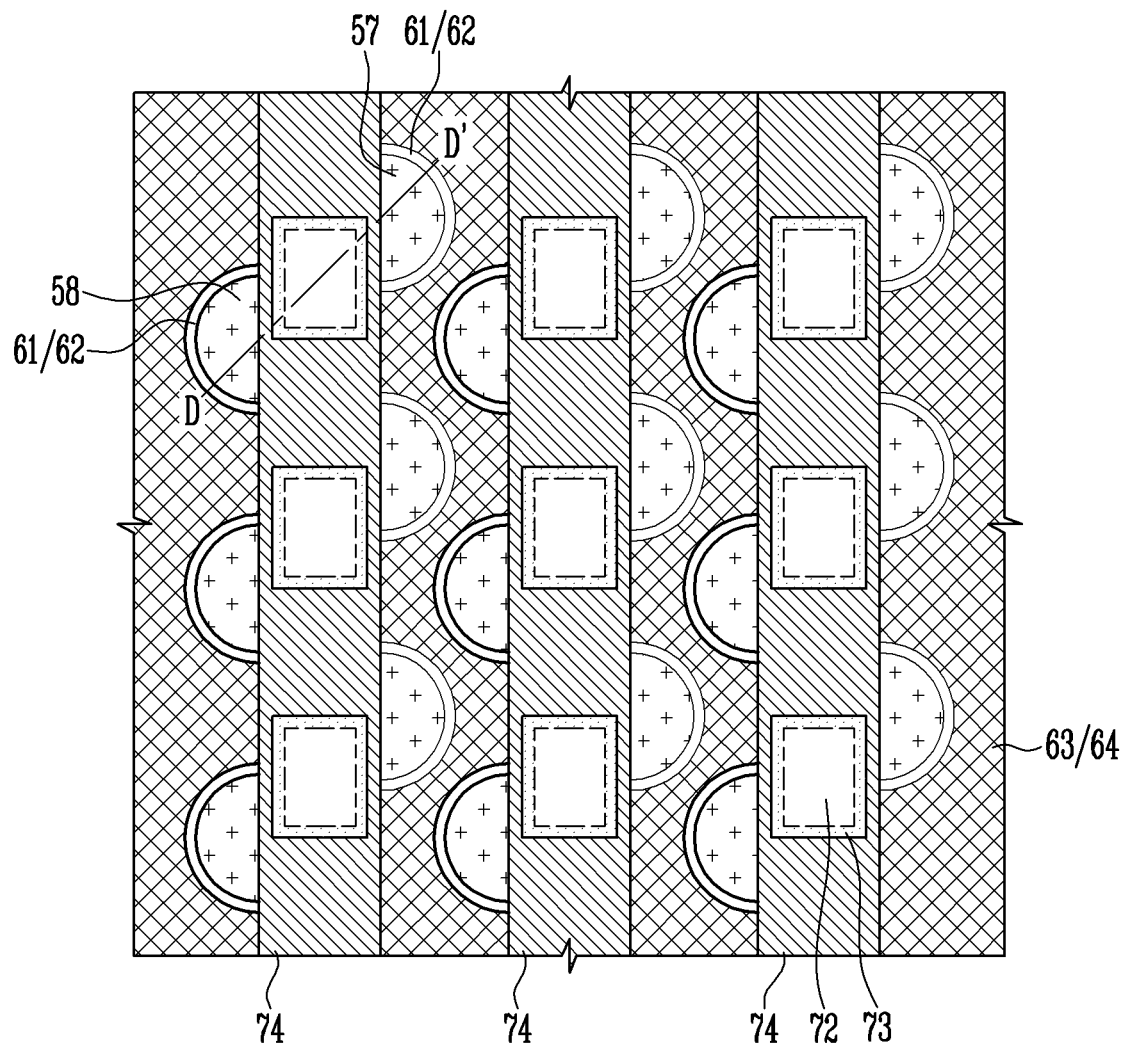
Figure 9B:
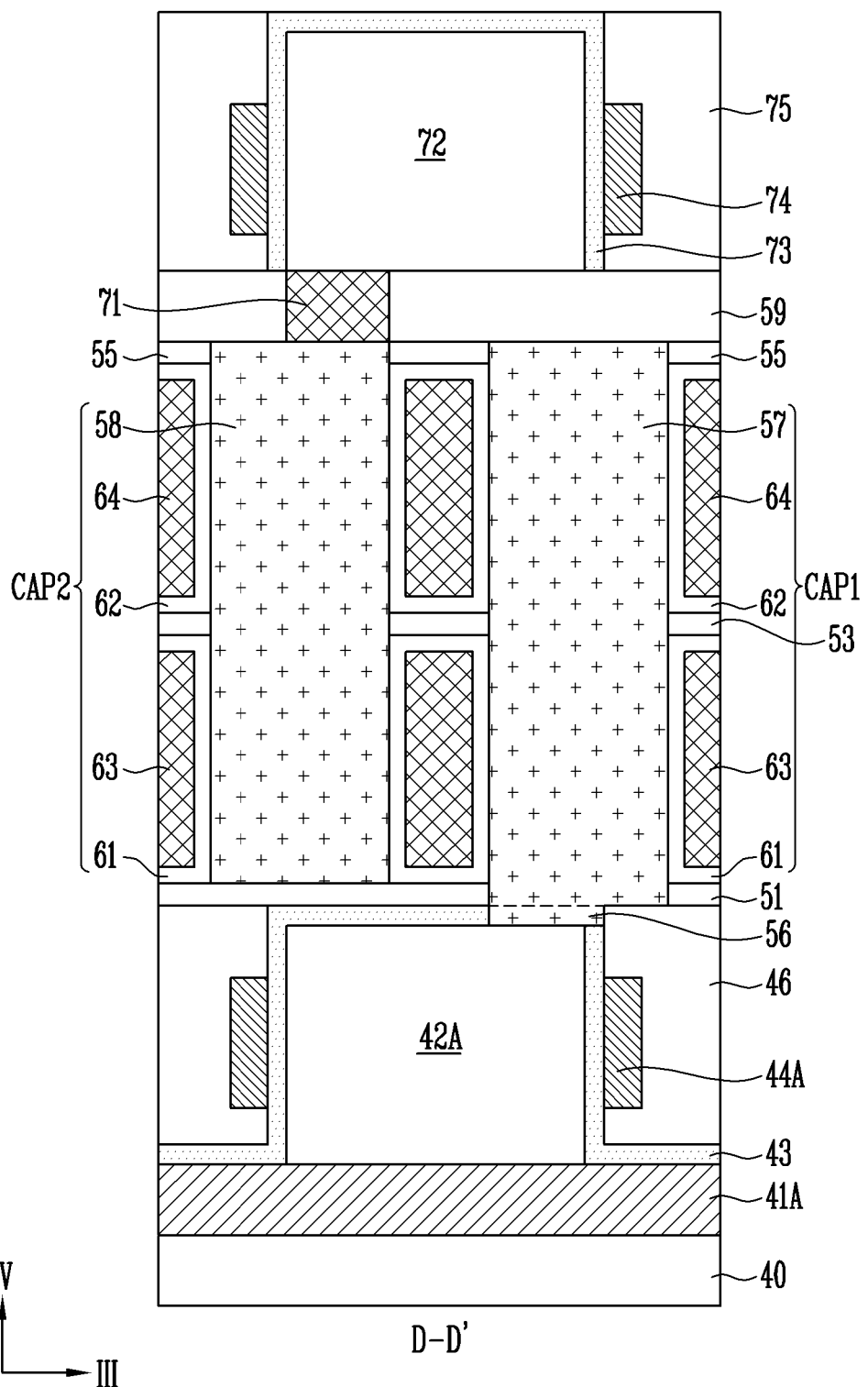

Referring to FIGS. 9A and 9B, second contact structures 71 are formed, which penetrate the interlayer insulating layer 59. The second contact structures 71 may be respectively connected electrically to the first electrode layer 58.

Subsequently, second channel layers 72 are formed. The second channel layers 72 may be formed by forming a second channel material layer on the interlayer insulating layer 59 and then patterning the second channel material layer. The second channel layers 72 may be formed at positions, in the first direction I and in the second direction II, corresponding to those of the first channel layers 42A. The second channel layers 72 may be respectively connected to the second contact structures 71. The second channel layers 72 may be electrically connected to the first electrode layer 58 through the second contact structures 71.

The second channel layers 72 may substantially include the same material as the first channel layers 42A, or include a material different from that of the first channel layers 42A. The second channel layers 72 may include a semiconductor material such as poly-silicon or silicon germanium, or include an oxide semiconductor such as Indium Gallium Zinc Oxide (IGZO). The second channel layers 72 may include a junction.

Subsequently, a second gate insulating layer 73 is formed on the second channel layers 72. The second gate insulating layer 73 may substantially include the same material as the first gate insulating layer 43, or include a material different from that of the first gate insulating layer 43. The second gate insulating layer 73 may include oxide.

Subsequently, second word lines 74 are formed. The second word lines 74 may be formed to surround sidewalls of the second channel layers 72. The second word lines 74 may be formed at positions corresponding to the first word lines 44A, and second word lines 74 may extend in the second direction II.

Subsequently, an interlayer insulating layer 75 is formed. In an embodiment, after an insulating material is formed to fill a space between the second word lines 74, the insulating material is planarized until an upper surface of the second gate insulating layer 73 is exposed. The interlayer insulating layer 75 may include an insulating material such as oxide.

Figure 10A:
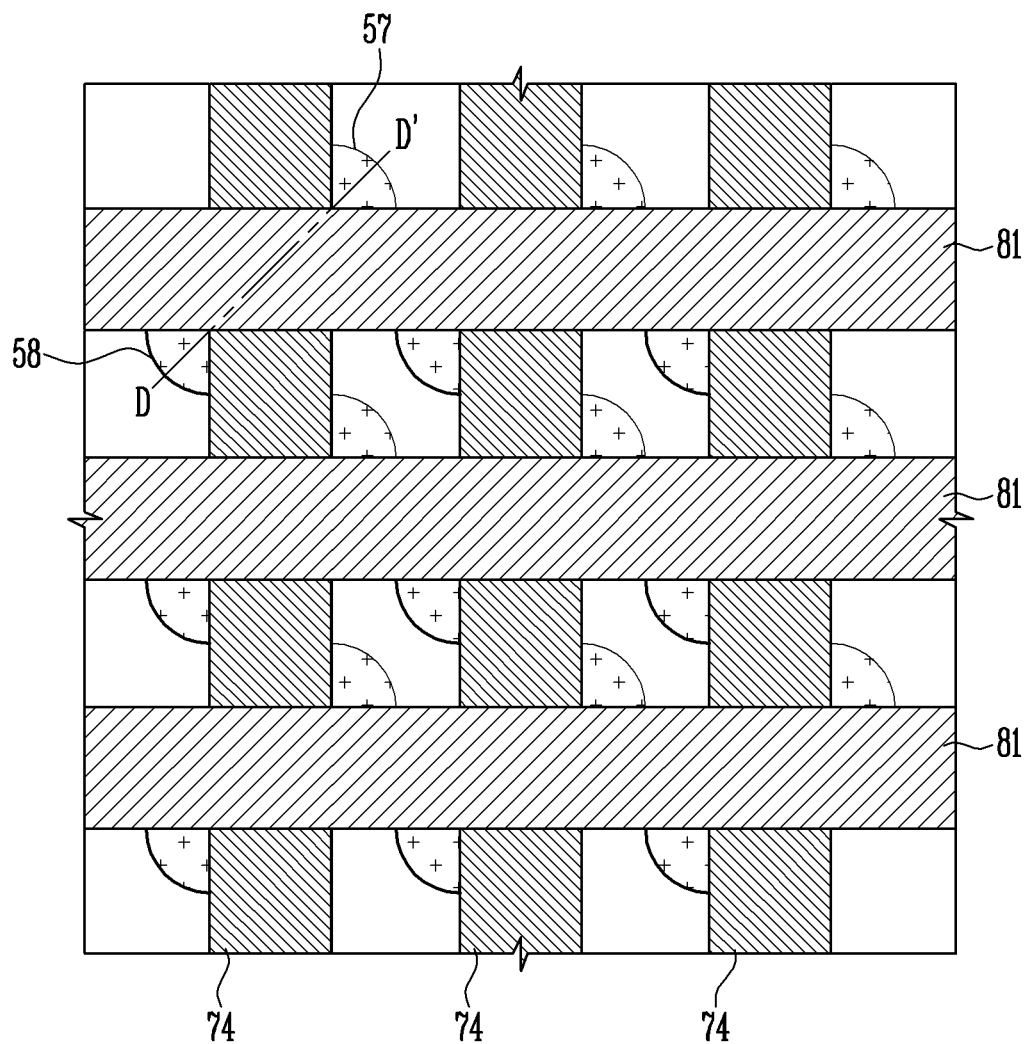
Figure 10A:
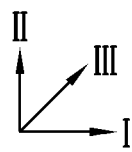
Figure 10B:
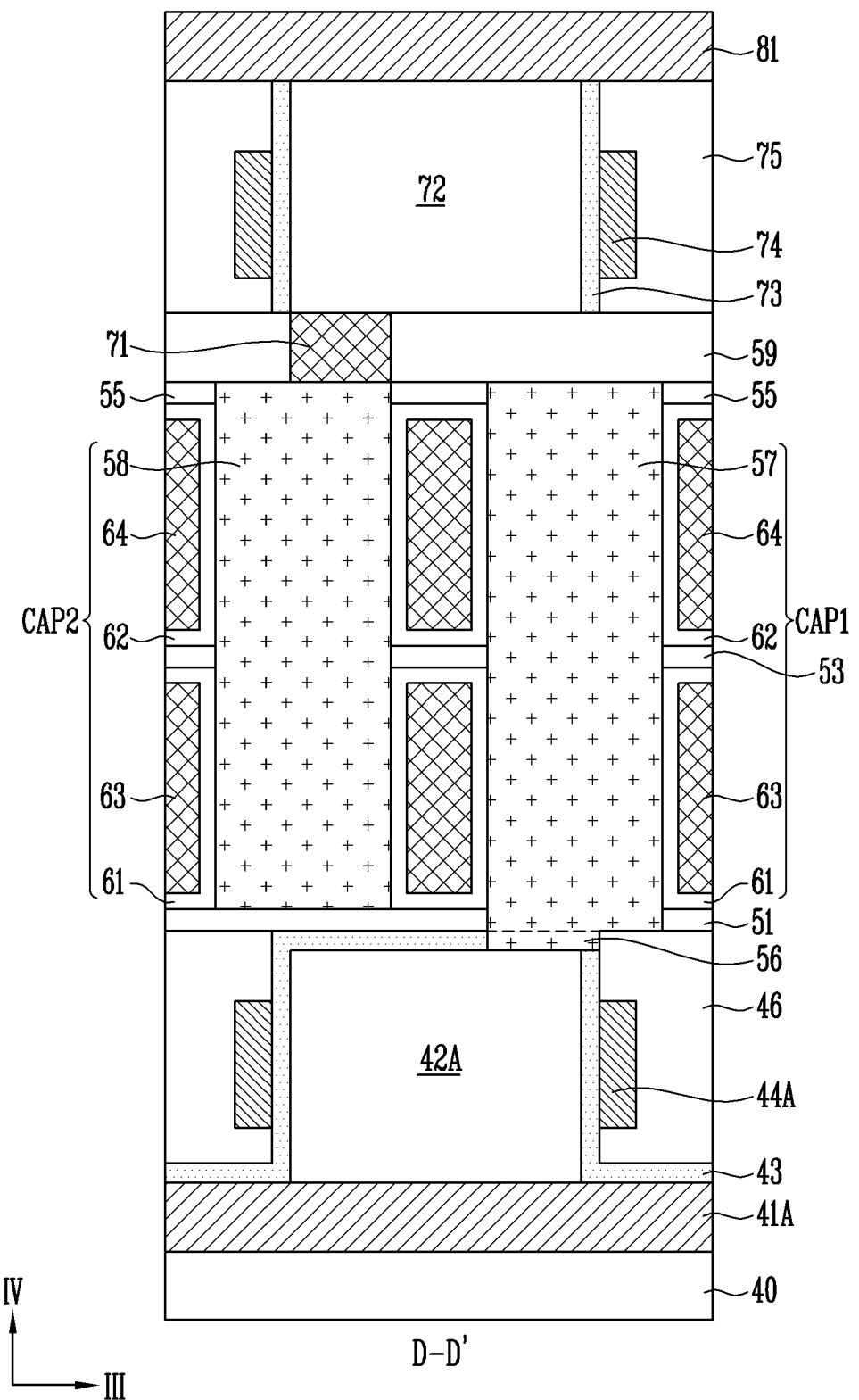

Referring to FIGS. 10A and 10B, second bit lines 81 are formed. The second bit lines 81 may be formed at positions corresponding to the first bit lines 41A, and may extend in the first direction I. In an embodiment, trenches may be formed by etching the interlayer insulating layer 75, and the second bit lines 81 may be formed by filling the trenches with a conductive material. Alternatively, a conductive material layer may be formed, the second bit lines 81 may be formed by etching the conductive material layer, and the interlayer insulating layer 75 may be formed between the second bit lines 81. Accordingly, a second array may be formed, which includes the second bit lines 81, the second word lines 74, and second transistors.

According to the manufacturing method described above, the first capacitor CAP1 and the second capacitor CAP2, which may share the second electrode layer 63 and the third electrode layer 64, can be formed between the first array and the second array. In addition, the first capacitor CAP1 can be electrically connected to the first array, and the second capacitor CAP2 can be electrically connected to the second array.

FIGS. 11A, 11B, 12A, 12B, 13A, 13B, 14A, and 14B are views illustrating a manufacturing method of a semiconductor device in accordance with an embodiment of the present disclosure. Hereinafter, descriptions of elements substantially similar to those described above and with reference to FIGS. 1A to 10B will be omitted.

Figure 11A:
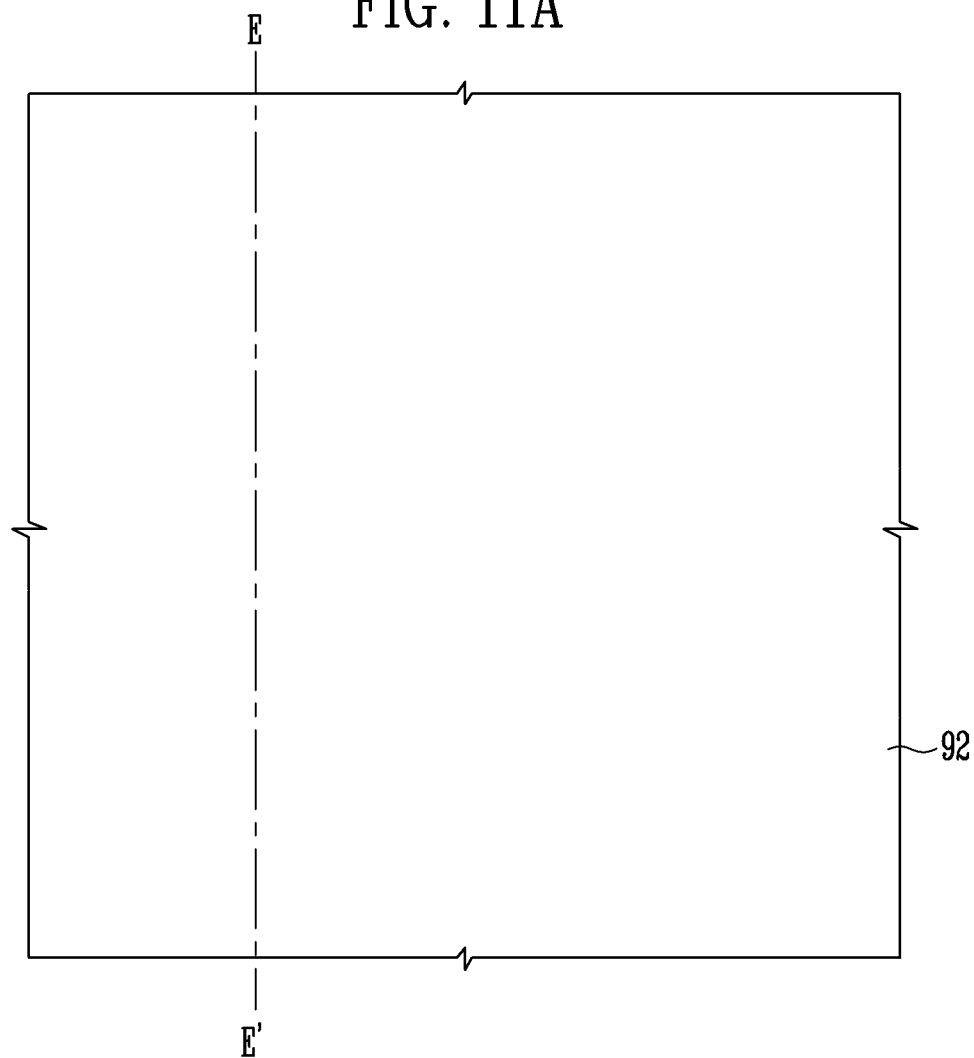
FIGS. 11A, 11B, 12A, 12B, 13A, 13B, 14A, and 14B are views illustrating a manufacturing method of a semiconductor device in accordance with an embodiment of the present disclosure.
Figure 11B:
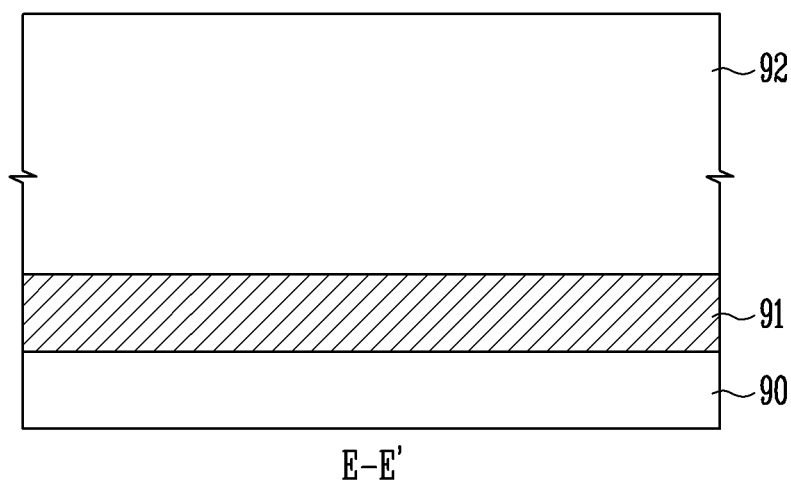
Figure 11B:
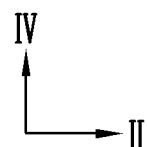

Referring to FIGS. 11A and 11B, a first conductive layer 91 is formed on a base 90, and a first channel material layer 92 is formed on the first conductive layer 91.

Figure 12A:
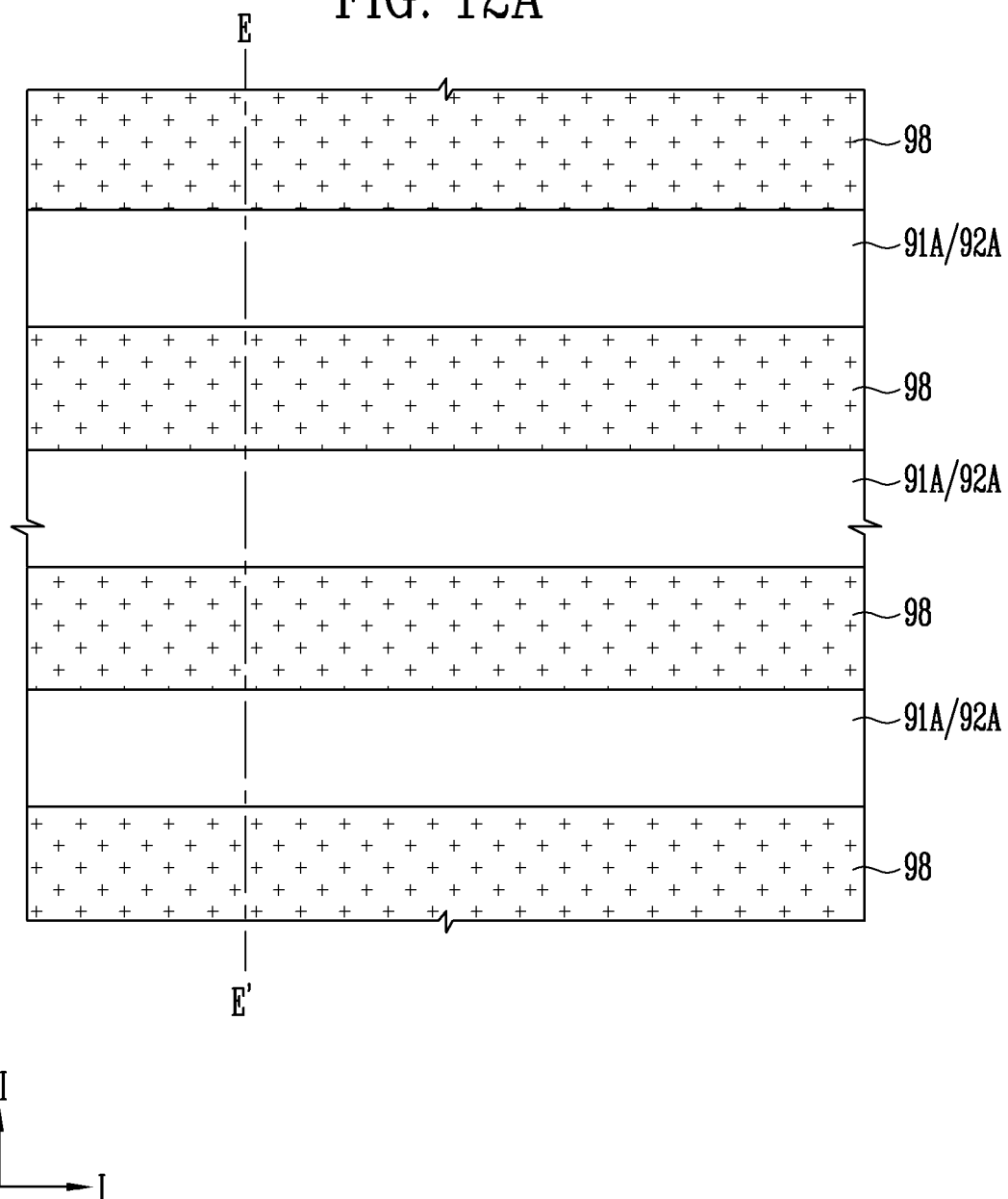
Figure 12B:
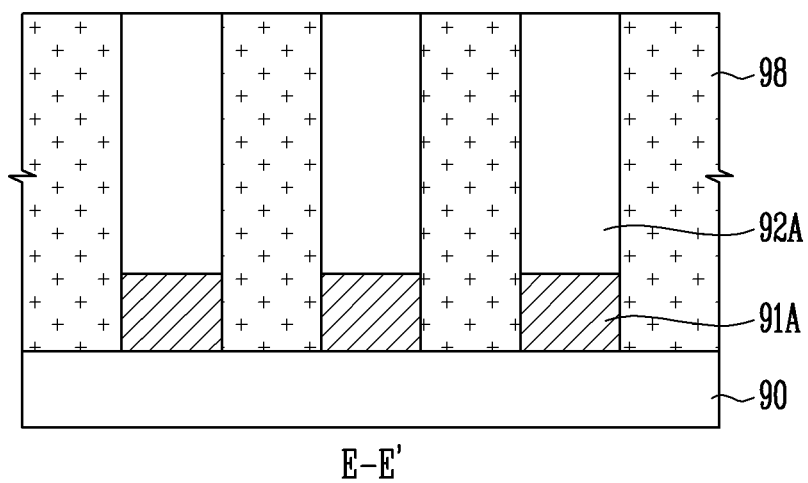
Figure 12B:
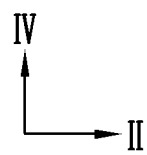

Referring to FIGS. 12A and 12B, first bit lines 91A and first channel material layers 92A are formed by etching the first channel material layer 92 and the first conductive layer 91. The first bit lines 91A and the first channel material layers 92A may extend in the first direction I.

Subsequently, gap fill insulating layers 98 are formed, filling in between the first bit lines 91A and in between the first channel material layers 92A. The gap fill insulating layers 98 may include an insulating material such as oxide.

Figure 13A:
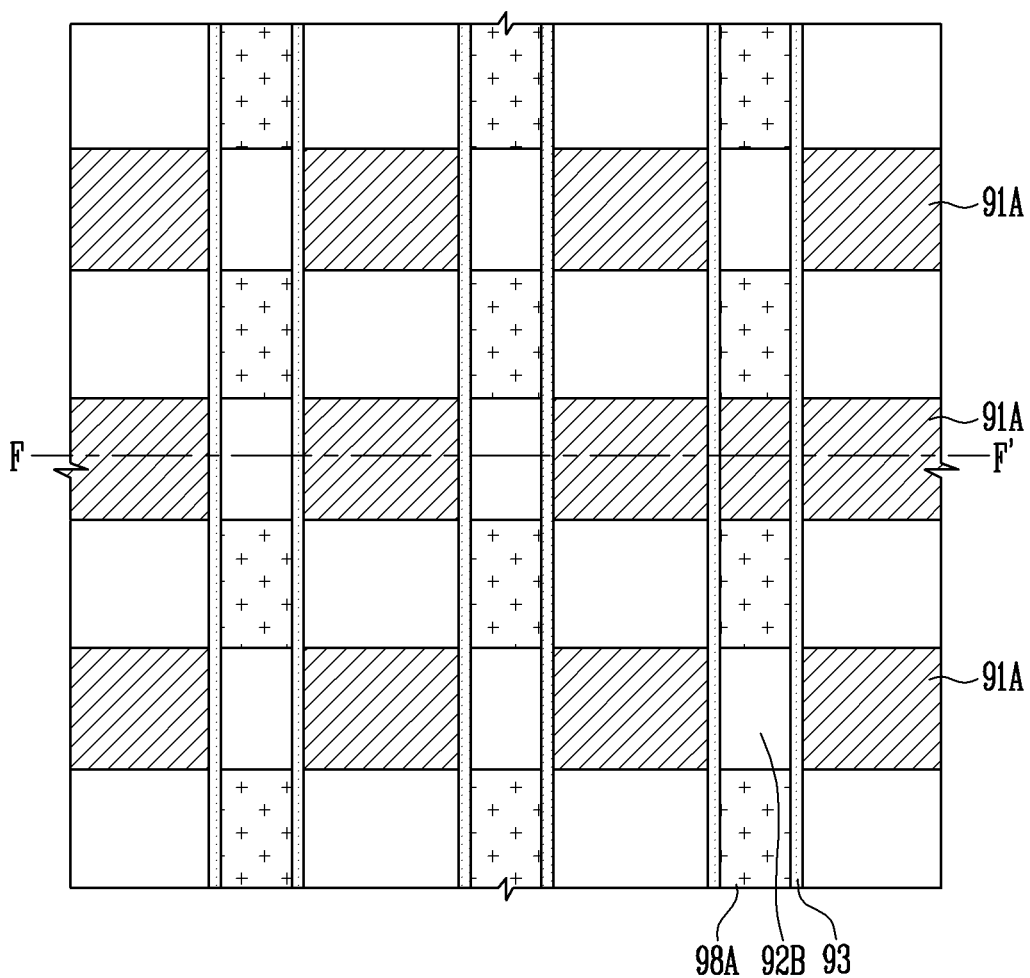
Figure 13B:
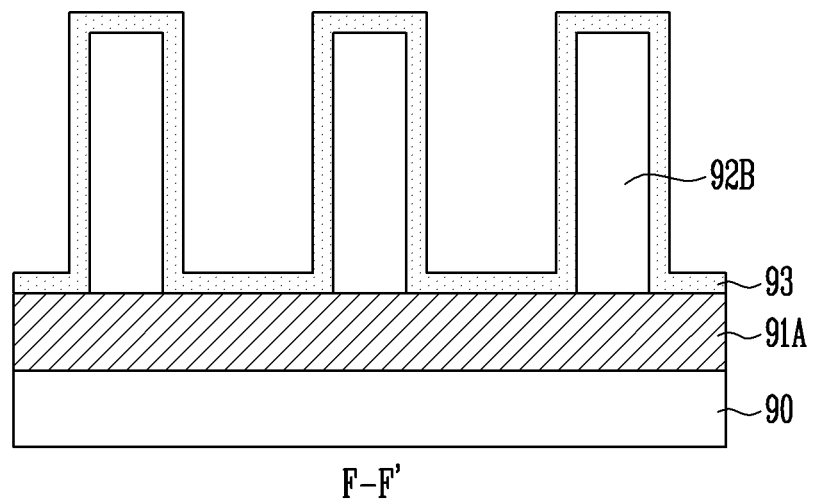
Figure 13B:
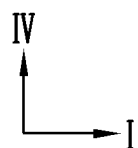

Referring to FIGS. 13A and 13B, first channel layers 92B and gap fill insulating patterns 98A are formed by etching the gap fill insulating layers 98 and the first channel material layers 92A. The gap fill insulating patterns 98A may be arranged in the first direction I and the second direction II. The gap fill insulating patterns 98A may be located between the first channel layers 92B adjacent to each other in the second direction II. The gap fill insulating patterns 98A and the first channel layers 92B may be alternately arranged along the second direction II.

Subsequently, a first gate insulating layer 93 is formed. The first gate insulating layer 93 may be formed to surround the first channel layers 92B and the gap fill insulating patterns 98A.

Figure 14A:
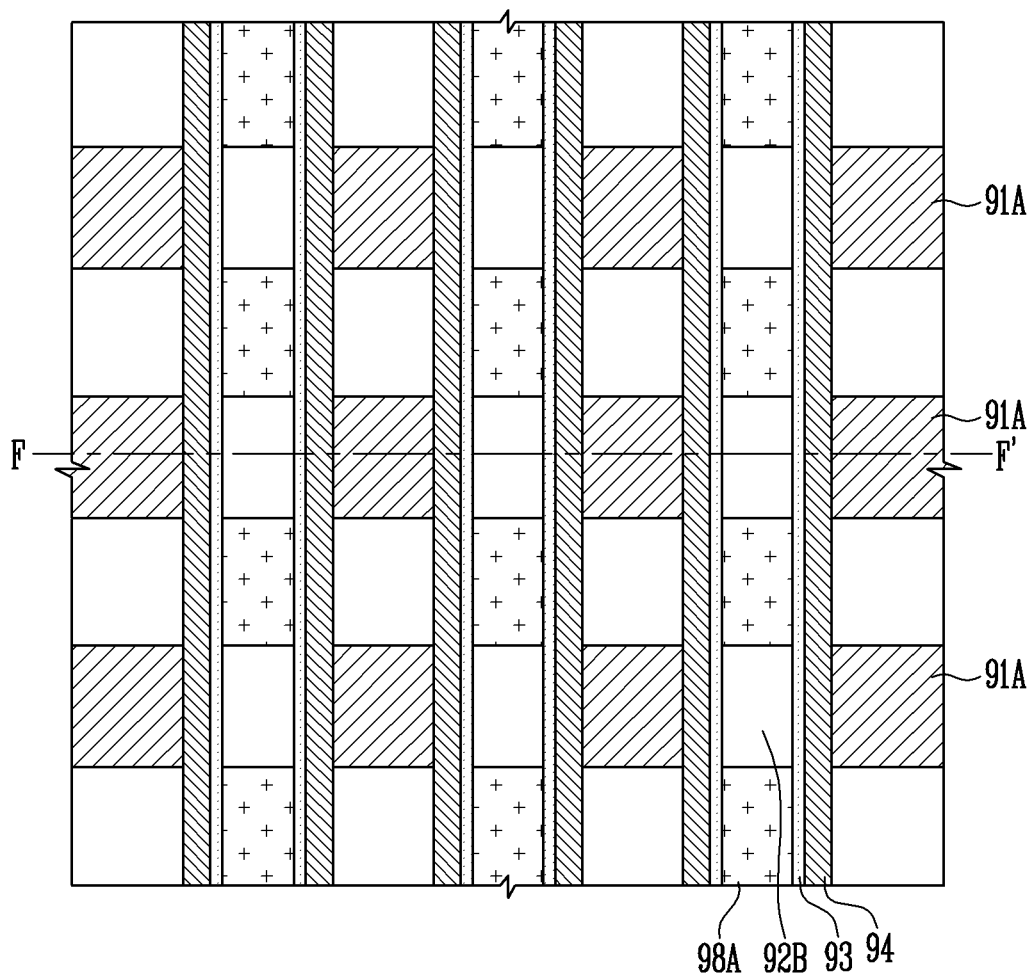
Figure 14B:
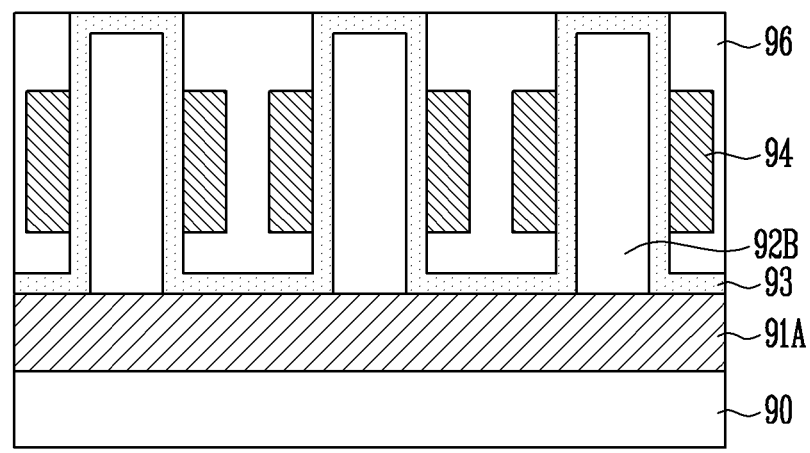
Figure 14B:
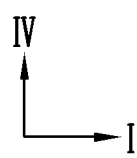

Referring to FIGS. 14A and 14B, first word lines 94 are formed, which surround sidewalls of the first channel layers 92B and the gap fill insulating patterns 98A. The first word lines 94 may extend in the second direction II. The first word lines 94 and subsequently an interlayer insulating layer 96 may be formed in accordance with embodiments described with reference to FIGS. 6A to 6D.

Accordingly, a first array may be formed, which includes the first bit lines 91A, the first word lines 94, and first transistors. Subsequently, a first capacitor C1 and a second capacitor C2 may be formed in accordance with embodiments described with reference to FIGS. 7A to 7E and 8A to 8C. In addition, a second array may be formed in accordance with embodiments described with reference to FIGS. 9A, 9B, 10A, and 10B. Alternatively, the second array may be formed in accordance with embodiments described with reference to FIGS. 11A, 11B, 12A, 12B, 13A, 13B, 14A, and 14B.

According to the manufacturing methods described above, the first channel layers 92B can be supported by the gap fill insulating patterns 98A. Thus, the semiconductor device can have a stable structure during the manufacturing process.

Figure 15A:
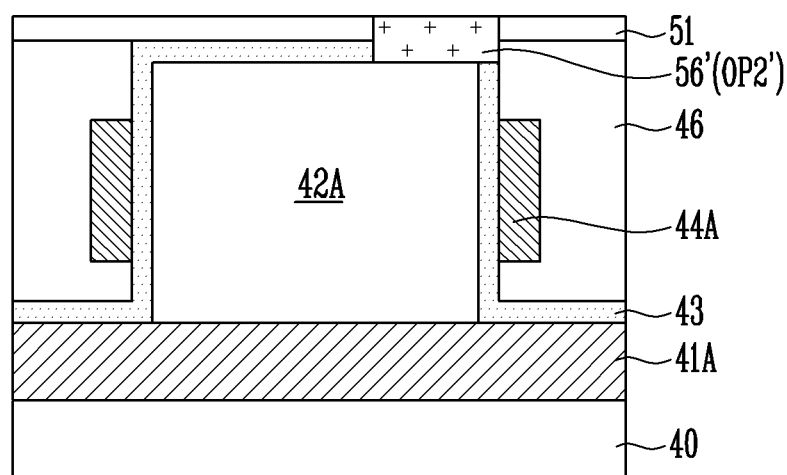
Figure 15A:
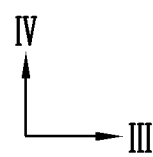

FIGS. 15A and 15B are views illustrating a manufacturing method of a semiconductor device in accordance with an embodiment of the present disclosure. Hereinafter, descriptions of elements substantially similar to those described above and with reference to FIGS. 1A to 14B will be omitted.

Referring to FIG. 15A, after a first channel layer 42A is formed on a base 40, a first gate insulating layer 43, a first word line 44A, and an interlayer insulating layer 46 are formed. Subsequently, a first cap layer 51 is formed on the first gate insulating layer 43 and the interlayer insulating layer 46. The manufacturing method described with reference to FIGS. 4A to 7B may be applied.

Subsequently, a second opening OP2' is formed by etching the first cap layer 51 and the first gate insulating layer 43. For example, the second opening OP2' may be formed by etching the first cap layer 51 and the first gate insulating layer 43, using, as an etch barrier, a mask pattern partially exposing the first gate insulating layer 43. The second opening OP2' may have a depth in which the second opening OP2' exposes the first channel layer 42A. Subsequently, a first contact structure 56' is formed in the second opening OP2'.

Referring to FIG. 15B, a sacrificial structure SC is formed by forming a first sacrificial layer 52, a second cap layer 53, a second sacrificial layer 54, and a third cap layer 55. Subsequently, a first opening OP1' and a third opening OP3' are formed, which penetrate the sacrificial structure SC. The first opening OP1' may be formed to have a depth in which the first opening OP1' exposes the first contact structure 56'. The third opening OP3' may be formed to have a depth in which the third opening OP3' exposes the first cap layer 51 without exposing the first channel layer 42A. The first cap layer 51 may be used as an etch stop layer when the third opening OP3' is formed.

Subsequently, a first electrode layer 57' is formed in the first opening OP1, and a first electrode layer 58' is formed in the third opening OP3'. The manufacturing method described with reference to FIGS. 8A to 10B may be applied to subsequent processes.

According to the manufacturing method described above, the third opening OP3' can be formed when the first opening OP1' is formed. In addition, the first electrode layer 58' can be formed when the first electrode layer 57' is formed.

In accordance with the present disclosure, transistors and capacitors are three-dimensionally stacked, so that the degree of integration of the semiconductor device can be improved. Further, the semiconductor device can have a stable structure and improved reliability.

The exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having definitions as defined in the dictionary should be understood such that they have meanings consistent with the context of the related technique. So far as not being clearly defined in this application, terms should not be understood in an ideal or excessively formal way.

What is claimed is:

1. A method of manufacturing a semiconductor device, the method comprising:
    forming a first array including a first bit line extending in a first direction, a first word line extending in a second direction intersecting the first direction, and a first transistor being located at a first intersection of the first word line and the first bit line, the first transistor being connected to the first word line and the first bit line;
    forming a first capacitor electrically connected to the first transistor, the first capacitor being located at a first part of the first intersection; and
    forming a second capacitor located at a second part of the first intersection,
    wherein forming of the first capacitor and forming of the second capacitor include:
    forming first electrode layers of the first and second capacitors extending in a vertical direction and overlapping with the first intersection in the vertical direction;
    forming a dielectric layer surrounding each of sidewalls of the first electrode layers; and
    forming a second electrode layer surrounding the sidewall of the first electrode layer of the first capacitor and continuously extending to surround the sidewall of the first electrode layer of the second capacitor, wherein the dielectric layer is disposed between the second electrode and each of the first electrode layers.

2. The method of claim 1, wherein the forming of the first array includes:
    forming the first bit line and first channel layers located on the first bit line;
    forming a first gate insulating layer surrounding the first channel layers; and
    forming the first word line, surrounding the first channel layers, on the first gate insulating layer.

3. The method of claim 1, further comprising forming a second contact structure connected to the second capacitor.

4. The method of claim 1, further comprising forming a array above the first capacitor and the second capacitor, wherein the second array includes a second bit line, a second word line intersecting the second bit line, and a second transistor located at a second intersection of the second word line and the second bit line, the second transistor being connected between the second word line and the second bit line.

5. The method of claim 4, wherein the forming of the second array includes:
    forming a second channel layer connected to the second capacitor;
    forming a second gate insulating layer surrounding the second channel layer;
    forming the second word line, surrounding a sidewall of the second channel layer, on the second gate insulating layer; and
    forming the second bit line connected to the second channel layer on the second word line.

6. A method of manufacturing a semiconductor device, the method comprising:
    forming a first array including a first bit line extending in a first direction, a first word line extending in a second direction intersecting the first direction, and a first transistor being located at a first intersection of the first word line and the first bit line, the first transistor being connected to the first word line and the first bit line;
    forming a first capacitor electrically connected to the first transistor, the first capacitor being located at a first part of the first intersection; and
    forming a second capacitor located at a second part of the first intersection,
    wherein the forming of the first capacitor includes:
    forming a first sacrificial layer on the first array;
    forming a cap layer on the first sacrificial layer;
    forming a second sacrificial layer on the cap layer; and
    forming a first opening penetrating the second sacrificial layer, the cap layer, and the first sacrificial layer.

7. The method of claim 6, further comprising:
    forming a second opening connected to the first opening, the second opening exposing a first channel layer of the first transistor; and
    forming a first contact structure connected to the first channel layer in the second opening.

8. The method of claim 6, wherein the forming of the first capacitor further includes:
    forming a first electrode layer in the first opening;
    forming a second opening by removing the first sacrificial layer;
    forming a third opening by removing the second sacrificial layer;
    forming a first dielectric layer in the second opening;
    forming a second electrode layer in the first dielectric layer;
    forming a second dielectric layer in the third opening; and
    forming a third electrode layer in the second dielectric layer.

9. The method of claim 8, wherein the third opening is formed when the second opening is formed, the second dielectric layer is formed when the first dielectric layer is formed, and the third electrode layer is formed when the second electrode layer is formed.

10. The method of claim 6, wherein the forming of the second capacitor includes:
   forming a first electrode layer in the first opening;
   forming a second opening by removing the first sacrificial layer;
   forming a third opening by removing the second sacrificial layer;
   forming a first dielectric layer in the second opening;
   forming a second electrode layer in the first dielectric layer;
   forming a second dielectric layer in the third opening; and
   forming a third electrode layer in the second dielectric layer.

11. The method of claim 10, wherein a bottom surface of the second opening is located between a bottom surface and a top surface of the first sacrificial layer.

* * * * *